United States Patent
Tomishima et al.

(10) Patent No.: US 6,327,195 B2
(45) Date of Patent: Dec. 4, 2001

(54) BOOSTED-VOLTAGE DRIVE CIRCUIT OPERABLE WITH HIGH RELIABILITY AND SEMICONDUCTOR MEMORY DEVICE EMPLOYING THE SAME

(75) Inventors: Shigeki Tomishima; Tsukasa Ooishi; Hiroki Shimano, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/737,587

(22) Filed: Dec. 18, 2000

Related U.S. Application Data

(62) Division of application No. 09/212,313, filed on Dec. 16, 1998, now Pat. No. 6,178,122.

(30) Foreign Application Priority Data

Aug. 11, 1998 (JP) .................................................. 10-227263

(51) Int. Cl.[7] .................................................. G11C 7/00
(52) U.S. Cl. ................ 365/189.11; 365/226; 365/230.06
(58) Field of Search ......................... 365/189.01, 230.01, 365/230.06, 189.11, 226, 227

(56) References Cited

U.S. PATENT DOCUMENTS

| | | |
|---|---|---|
| 5,587,960 | 12/1996 | Ferris . |
| 5,608,670 | 3/1997 | Akaogi . |
| 5,619,450 | 4/1997 | Takeguchi . |
| 5,761,135 * | 6/1998 | Lee ................................... 365/189.11 |
| 5,808,955 * | 9/1998 | Hwang et al. ................... 365/230.06 |
| 5,926,430 | 7/1999 | Noda et al. . |
| 5,946,243 * | 8/1999 | Sim ................................. 365/189.11 |
| 5,953,261 | 9/1999 | Furutani et al. . |
| 6,011,746 * | 1/2000 | Ow ................................. 365/230.06 |
| 6,026,047 * | 2/2000 | Kyu et al. ....................... 365/230.06 |
| 6,154,399 * | 11/2000 | Ogishima ............................. 365/200 |
| 6,178,122 * | 1/2001 | Tomishima et al. ............. 365/189.11 |

FOREIGN PATENT DOCUMENTS

| | | |
|---|---|---|
| 7-244982 | 9/1995 | (JP) . |
| 9-180444 | 7/1997 | (JP) . |

OTHER PUBLICATIONS

"Hot–Carrier Generation in Submicrometer" by Sakurai et al., IEEE Journal of Solid–State Circuits, vol. SC–21, No. 1, Feb. 1986.

"VLSI Circuit Reliability Under AC Hot–Carrier Stress" by Nogami et al., 1987 Symposium on VLSI Circuits Digest of Technical Papers, May 1987.

* cited by examiner

*Primary Examiner*—Viet Q. Nguyen
(74) *Attorney, Agent, or Firm*—McDermott, Will & Emery

(57) ABSTRACT

A sub word line is selected when an associated word line and any of sub decode lines are driven to attain a boosted potential. In a sub decoder selectively driving any of the sub decode lines, the pull-down transistors allowing the sub decode line to discharge are turned on successively with time in a pulsing manner.

4 Claims, 30 Drawing Sheets

BOOSTED-VOLTAGE DRIVE CIRCUIT OPERABLE WITH HIGH RELIABILITY AND SEMICONDUCTOR MEMORY DEVICE EMPLOYING THE SAME

This application is a Divisional of application Ser. No. 09/212,313 filed Dec. 16, 1998 now U.S. Pat. No. 6,178,122.

BACKGROUND OF THE INVENTION

1. Field of the Invention

The present invention relates to boosted-voltage drive circuits which drive a voltage boosted as compared to an external power supply voltage, and semiconductor devices employing the same.

2. Description of the Background Art

In semiconductor integrated circuit devices, e.g. semiconductor memory devices, a power supply voltage lower than an external power supply voltage Vdd can be generated on chip and supplied as an internal power supply voltage Vcc to ensure reliability and the like. In semiconductor devices, dynamic random access memories (DRAMs) in particular, however, a voltage boosted as compared to an external power supply potential can be generated on chip as a potential to drive a word line for selecting a memory cell.

FIG. 28 is a schematic block diagram showing a configuration of a memory array in a conventional DRAM.

A memory array MA is divided into blocks or a plurality of memory sub arrays SMA1 to SMAn. Sense amplifier bands SAB1 to SABn−1 have any sense amplifier band SABj shared e.g. by adjacent memory sub arrays SMAj and SMAj+1. Furthermore, sense amplifier bands SAB0 and SABn are provided outside memory sub arrays SMA1 and SMAn, respectively.

Memory sub arrays SMA1 to SMAn are provided with block row decoders BRD1 to BRDn, respectively. Sense amplifier bands SAB1 to SABn−1 are provided with sense amplifier control circuits SAC0 to SACn, respectively.

There are also provided word line drivers WD1 to WDn which respond to a signal decoded by block row decoders BRD1 to BRDn to drive the potential level of the corresponding word line to an active level (potential Vpp).

For example, when memory sub array SMA1 is selected in response to an externally applied row address signal, word line driver WD1 powered with a boosted voltage starts to operate according to a result obtained from the address signal decoded by block row decoder BRD1 and drives a selected word line in memory sub array SMA1 to the potential Vpp level.

The data read from a memory cell thus selected is amplified by a sense amplifier of sense amplifier band SAB1 via a bit line. When the read cycle completes, word line driver WD1 again operates to decrease the potential level of the word line from the potential Vpp level to a ground potential level (GND level).

In addition, for example, a bit-line isolation signal line is provided to control a block select transistor for providing isolation of a bit line between memory sub array SAB1 and sense amplifier band SAB1. As is similar to a word line, the bit-line isolation signal line transmits a signal which is driven to attain potential level Vpp.

In a standby state the bit-line isolation signal line is held at potential level Vpp so as to prevent drop of the voltage corresponding to the threshold voltage of the block select transistor. When a read cycle is started, before the potential level of a word line initially rises to a selected, potential level (Vpp) the bit-line isolation signal line for selectively providing isolation of a bit line between non-selected memory sub array SMA1 and sense amplifier band SAB1 falls from potential level Vpp to the GND level. When the read cycle completes, the bit-line isolation signal line for the non-selected memory sub array SMA1 again rises to potential level Vpp.

FIG. 29 is a circuit diagram for illustrating a configuration of sense amplifier band SABi shown in FIG. 28.

Sense amplifier band SAB1 includes a sense amplifier SA including an n-channel transistor amplifier configured of n-channel MOS transistors N10 and N12 and p-channel transistor amplifier configured of p-channel MOS transistors P10 and P12, and block select gate BSG1 responsive to a signal ISO1 for selectively opening and closing a connection between sense amplifier SA and a pair of bit lines BL1,/BL1 in memory sub array SMA1.

BSG1 includes an n-channel MOS transistor N20 having its gate potential driven by a bit-line isolation signal line ISO1 for opening and closing a connection of bit line BL1 to one input node of sense amplifier SA, and n-channel MOS transistor N22 having its gate potential driven by signal ISO1 transmitted on bit-line isolation signal line ISO1 for selectively opening and closing a connection of bit line /BL1 to the other input node of sense amplifier SA.

Sense amplifier band SAB1 also includes a block select gate BSG2 which selectively opens and closes a connection between a pair of bit lines BL2, /BL2 in memory sub array SMA2 and sense amplifier SA. Block select gate BSG2 includes an n-channel MOS transistor N24 having its gate potential driven by a bit-line isolation signal line ISO2 for selectively opening and closing a connection between bit line BL2 and one input node of sense amplifier SA, and an n-channel MOS transistor N26 having its gate potential driven by signal line ISO2 for selectively opening and closing a connection between bit line /BL2 and the other input node of sense amplifier SA.

Sense amplifier band SAB1 also includes a select gate SG opening and closing a connection between an associated I/O line pair and an associated bit line pair in response to a column select signal YL from a column decoder CLD, and a precharge circuit PCC responsive to a precharge signal RP for precharging an associated bit line pair to attain a precharge potential Vcc/2 corresponding to half the potential level of internal power supply potential Vcc.

As described above, bit-line isolation signal lines ISO1 and ISO2 are also driven to the level of boosted potential Vpp.

FIG. 30 is a circuit diagram illustrating a configuration of a first conventional level shifter circuit 9000 for converting a signal having the logical amplitude of the internal power supply potential Vcc level to that having the logical amplitude of the boosted voltage Vpp level in a circuit block powered with boosted voltage Vpp as described above.

Level shifter circuit 9000 includes p-channel MOS transistors P30 and P32 having their respective sources receiving power supply potential Vpp and their respective gates and drains cross-coupled with each other, and n-channel MOS transistors N30 and N32 respectively connected between the drains of p-channel MOS transistors P30 and P32 and ground potential GND.

The gate of n-channel MOS transistor N30 is driven by an input signal IN having the logical amplitude of internal power supply voltage Vcc. The gate of n-channel MOS transistor N32 is driven by a signal output from an inverter INV1 driven by power supply potential Vcc and receiving and inverting signal IN for output.

FIG. 31 is a timing chart for representing an operation of level shifter circuit 9000 shown in FIG. 30.

At time t1, input signal IN rises from ground potential GND to internal power supply potential Vcc and responsively transistor N30 is turned on and the gate potential of p-channel MOS transistor P32 rises to ground potential GND. Responsively transistor P32 is turned on, while the output from inverter INV1 attains the GND level and responsively a signal OUT rises to boosted potential Vpp at time t2, since n-channel MOS transistor N32 has been turned off.

At time t3, input signal IN falls to ground potential GND and responsively transistor N30 is turned off and transistor N32 is turned on. Since transistor P30 turned off allows the gate of transistor P32 to be charged to attains potential level Vpp, transistor P32 is turned off and transistor N32 turned on thus allows output signal OUT to fall to ground potential GND at time t4.

FIG. 32 is a circuit diagram for illustrating a configuration of a second conventional level shifter circuit 9200.

Level shifter circuit 9200 differs in configuration from level shifter circuit 9000, as described below.

That is, transistor N30 is replaced by a transistor N40 receiving power supply potential Vcc at its gate and input signal IN at its source, and transistor N32 is replaced by an n-channel MOS transistor N42 receiving input signal IN at its gate and connected between the source of transistor P32 and ground potential GND.

FIG. 33 is a timing chart for representing an operation of level shifter circuit 9200 shown in FIG. 32.

At time t1, input signal IN rises from potential level Vcc to ground potential GND and responsively transistor N40 is turned on and the gate potential level of transistor P32 drops to the ground potential. Since transistor N42 is turned off, output signal OUT rises to power supply potential Vpp.

At time t2, input signal IN rises from potential level GND to power supply potential Vcc and responsively transistor N40 is turned off and transistor N42 is turned on. Responsively, transistor N42 allows the output node to discharge and signal OUT falls from potential Vpp to ground potential GND.

FIG. 34 is a circuit diagram for illustrating a configuration of a third conventional level shifter circuit 9400.

Level shifter circuit 9400 includes p- and n-channel MOS transistors P48 and N52 connected in series between power supply potential Vpp and ground potential GND, and a p-channel MOS transistor P50 connected between power supply potential Vpp and a connection point between transistors P48 and N52.

The gate of p-channel MOS transistor P48 receives a signal PR changing in the amplitude of voltage Vpp, and the gate of transistor N52 receives signal IN changing in the amplitude of voltage Vcc.

Level shifter circuit 9400 also includes a p-channel MOS transistor P52 and an n-channel MOS transistor N54 operating as an inverter connected between power supply potential Vpp and ground potential GND.

An input node of inverter 9402 configured of transistor P52 and N54 is connected to a connection node of transistors P48 and N52. The gate of transistor P50 is connected to an output node of inverter 9402.

FIG. 35 is a timing chart for representing an operation of level shifter circuit 9400.

At time t1, signal PR rises from potential level GND to potential level Vpp. Responsively, transistor P48, which has been turned on prior to time t1, is turned off. At time t2, signal IN rises from ground potential GND to potential Vcc. Thus, transistor N52 is turned on and the input node of inverter 9402 falls to the ground potential. Responsively, at time t3, output signal OUT rises from ground potential GND to potential level Vpp.

At time t4, signal IN falls to ground potential GND. Responsively, transistor N52 is turned off. At time t5, input signal PR falls to ground potential GND. Responsively, transistor P48 is turned on. Thus, the input node of inverter 9402 rises to potential level Vpp and responsively at time t6 output signal OUT falls to ground potential GND.

In general the level shifter as described above allows a signal changing in the amplitude of potential Vcc to be converted to a signal changing in the logical amplitude of boosted potential Vpp.

Meanwhile, as transistors configuring a semiconductor integrated circuit are increasingly microfabricated, an n-channel MOS transistor provided particularly for a circuit block powered by such boosted voltage Vpp and having its drain connected to an output node providing an output changing in the amplitude of boosted voltage Vpp, has its longevity reduced disadvantageously due to hot carrier.

That is, the channel electrons flowing from the source to drain of such an n-channel MOS transistor obtain high energy resulting from a strong electric field in a vicinity of the drain and thus causes collision current at an end of the drain. A portion of the electrons and hot holes generated by the collision current are injected into and captured by a gate oxide film to cause the so-called hot carrier injection. Consequently, the threshold value, conductance and the like of the transistor shifts with time and the circuit eventually fails to operate normally.

The hot carrier injection as described above is maximized when drain and gate voltages are applied to achieve a gate-source voltage VGS of ½ Vds, wherein Vds represents the drain-source voltage. Thus, in the inverter as shown in FIG. 36, hot carrier is significantly generated during the logical transition period during which input signal IN crosses the logical threshold value, as shown in FIG. 37. As is disclosed in Journal of Solid-State Circuits Vol. SC-21 (1986) pp. 187–191, it is known that hot carrier generation is greater when an output node having been charged to attain a logical high level discharges and attains ground potential GND.

The disadvantage described above is overcome e.g. by the so-called Normally-On Enhancement Mostet Insertion (NOEMI) technique, i.e. insertion of a normally-on transistor between an output node having the amplitude of boosted voltage Vpp and a pull-down transistor, as described in 1987 Symp. VLSI Circuits Dig. Tech. Papers pp.13–14, for example. FIG. 38 is a circuit diagram showing an exemplary configuration of the NOEMI technique described above for an inverter.

A p-channel MOS transistor P1 and n-channel MOS transistors N1 and N2 are connected in series between boosted potential Vpp and ground potential GND. N-channel MOS transistor M1 is always turned on, receiving a potential VGG at its gate. Under the conditions, the maximum source-drain voltage Vds applied to n-channel MOS transistor M1 is Vpp−(VGG−Vt) and the maximum source-drain voltage Vds applied to transistor M2 is Vgg−Vt, wherein Vt represents the threshold voltage of transistor M1.

The introduction of transistor M1 can alleviate source-drain voltage Vds applied to each of n-channel MOS transistors M1 and M2 and significantly reduce the generation of hot carrier to overcome the disadvantageously reduced longevity of the transistors described above.

In the NOEMI technique as described above, however, transistors M1 and M2 corresponding to n-channel MOS pull-down transistor are connected in series. Thus, it disadvantageously requires an increased period of time to pull an output node charged to attains to the boosted voltage Vpp level down to the ground potential GND level. In particular, word lines and bit-line isolation signal lines, which have large load capacity, are subject to significant time delay which disadvantageously results in the delay in access time in DRAMs and the like.

Disadvantage of Hierarchical Word-Line Configuration

Word lines in the so-called, hierarchical word-line configuration have the disadvantage described below.

FIG. 39 is a schematic block diagram for illustrating a configuration of a memory cell array mat for the hierarchical word-line configuration.

The memory cell array mat differs in configuration from that described with reference to FIG. 28, as described below.

Initially, in response to an externally applied row address signal, a row predecoder RPD predecodes the row address signal. Responsively a main word driver MVD activates a main word line MWL selected.

In response to the predecoded signal from row predecoder RPD, a subdecoder SDR also activates the potential level of a sub decode line SD corresponding to the selected row address.

A sub word driver SWD provided at an intersection of the selected main word line MWL and the selected sub decoder line SDL allows sub word line SWL to be placed in a selected state.

FIG. 40 is a circuit diagram for illustrating a configuration of subdecoder SDR and main word line MWL and sub word line SWL.

Sub decoder SDR is adapted to respond e.g. to a predecoded signal to activate any of four subdecode lines SDO to SD3.

For example, when a predecoded signal HIT1 is placed in an active state, signal HIT1 is input to an input node of an inverter configured of a p-channel MOS transistor P80 and an n-channel MOS transistor N80 connected between boosted potential Vpp and ground potential GND. In response to the activation of signal HIT1 (or a transition of signal HIT1 to a low level), a sub decode signal SD1 is placed in an active state (or the potential level Vpp state).

Among the sub word lines connected to a then active main word line MWL (i.e. a word line at boosted potential Vpp) are activated sub word lines SWL10 to SWL1n selected by sub decode line SD1.

For example, sub word line SWL in is connected to an output node of the inverter configured of p-channel MOS transistor P82 and an n-channel MOS transistor N82 connected between sub word line SD1 and ground potential GND. The inverter configured of transistors P82 and N82 has an input node connected to main word line MWL.

FIG. 41 is a time chart showing the potential level of a node N1, the potential level of signal HIT1, and a substrate current Isub of n-channel MOS transistor N80 that vary with time in the configuration described above, wherein node N1 is a drain node of n-channel MOS transistor N80 which drives sub decode line SD1.

At time t1, signal HIT1 starts to transition to an inactive state or the potential Vpp level. Responsively, n-channel MOS transistor N80 starts to discharge and the potential level of node N1 starts to drop towards ground potential GND, while substrate current Isub having a high peak value flows in n-channel MOS transistor N80.

Similarly, at time t2, signal HIT1 starts to transition from potential level Vpp towards ground potential GND. Responsively, the potential level of node N1 starts to rise from ground potential GND towards potential level Vpp, while substrate current Isub flows in transistor N80.

As described above, such substrate current Isub flowing in transistor N80 means that impact ionization is caused at the drain of transistor N80 and thus degrades the reliability of transistor N80.

Furthermore, for the hierarchical word-line configuration as shown in FIG. 40, sub decoder SDR operates more frequently than a driver which drives main word line MWL, since sub decoder SDR is required to operate when any of main word lines MWL is selected.

In other words, although an n-channel MOS transistor present in main word driver MWD operates in the logical amplitude between boosted potential Vpp and ground potential GND, transistor N80 in sub decoder SDR operates more frequently than the n-channel MOS transistor in main word driver MWD and any degradation of its reliability will be a severe disadvantage.

SUMMARY OF THE INVENTION

One object of the present invention is to provide a boosted-voltage drive circuit capable of restricting the reduction of the longevity of a transistor caused by hot carrier injection, without decreasing access speed.

Another object of the present invention is to provide a semiconductor memory device having a hierarchical word-line configuration, capable of restricting the degradation in reliability of a transistor in a sub decoder.

Briefly speaking, the present invention provides a semiconductor memory device formed on a semiconductor substrate and including a booster circuit, a memory cell array, a plurality of sub word lines, a plurality of main word lines, a plurality of sub decoder lines, a sub word line drive circuit, a main row select circuit, and a sub decode circuit.

The booster circuit externally receives a first power supply potential and a second power supply potential higher than the first power supply potential and provide a boosted potential higher than the second power supply potential. The memory cell array includes a memory cells arranged in a matrix.

The plurality of sub word lines are each provided for a first plurality of memory cells along a row of the memory cell array, for selecting a memory cell. The plurality of main word lines are provided corresponding to the rows in the memory cell array. The plurality of sub decode lines select any of the plurality of sub word lines.

The sub word line drive circuit is provided for a sub word line. When a main word line is activated and an associated sub decode line is driven to attain a boosted potential, the sub word line drive circuit responsively drives and thus allows an associated sub word line to attain a boosted potential. The main row select circuit responds to an address signal to selectively activate a main word line.

The sub decode circuit responds to an address signal to selectively drive and thus allow a sub decode line to attain a boosted potential.

The sub decode circuit includes a pull-up transistor for selectively charging and thus allowing a sub decode line to attain a boosted potential, a plurality of pull-down transistors for selectively allowing a sub decode line to discharge and thus attain the first power supply potential, and a substrate current limit circuit limiting a substrate current flowing through the semiconductor substrate to reduce an average in said substrate current for a plurality of discharge operations of a sub decode line per pull-down transistor.

In another aspect of the present invention, a semiconductor memory device is formed on a semiconductor substrate and includes a booster circuit, a memory cell array, a plurality of sub word lines, a plurality of main word lines, a main row select circuit, a plurality of first sub decode lines, a first sub word line drive circuit, a first sub decode circuit, a plurality of second sub decode lines, a second sub word line drive circuit, and a second sub decode circuit.

The booster circuit externally receives a first power supply potential and a second power supply potential higher than the first potential, and provides a boosted potential higher than the second potential.

The memory cell array includes a plurality of memory cells arranged in a matrix. The memory cell array includes a regular memory cell array having a plurality of regular rows of memory cells, and a redundant memory cell array having a plurality of redundant rows of memory cells for replacing any defective memory cell in the regular memory cell array.

The plurality of sub word lines are each provided for a first plurality of memory cells along a row of the memory cell array, and select a memory cell. The plurality of main word lines are provided corresponding to the rows of the memory cell array. The main row select circuit responds to an address signal to selectively activate a main word line. The plurality of first sub decode lines are provided for the regular memory cell array and select any of the plurality of sub word lines. The first sub word line driver circuit is provided for a sub word line in the regular memory cell array. When a main word line is activated and an associated, first sub decode line is driven to attain a boosted potential, the first sub word line drive circuit responsively drives and thus allows an associated sub word line to attain a boosted potential.

The first sub decode circuit is provided for the regular memory cell array and responds to an address signal to selectively drive and thus allow a first sub decode line to attain a boosted potential.

The plurality of second sub decode lines are provided for the redundant memory cell array and select any of the plurality of sub word lines.

Second sub word line drive circuit is provided for a sub word line in the redundant memory cell array. When a main word line is activated and an associated, second sub decode line is driven to attain a boosted potential, the second sub word line drive circuit responsively drives and thus allows an associated sub word line to attain a boosted potential.

The second sub decode circuit is provided for the redundant memory cell array and responds to an address signal to selectively drive and thus allow a second sub decode line to attain a boosted potential.

The second sub decode circuit includes a pull-up transistor for selectively charging and thus allowing a second sub decode line to attain a boosted potential, a plurality of pull-down transistors selectively allowing a second sub decode line to discharge and attain the first power supply potential, and a substrate current limit circuit limiting a substrate current flowing through the semiconductor substrate to reduce an average in said substrate current for a plurality of discharge operations of a second sub decode line per pull-down transistor.

In another aspect of the present invention, a boosted-voltage drive circuit formed on a semiconductor substrate and responding to activation of an input signal corresponding to one of a first potential and a second potential higher than the first potential to produce an output signal having a boosted potential higher than the second potential, includes an output node, a pull-up transistor, a plurality of pull-down transistors, and a substrate current limit circuit.

The output node receives an output signal.

The pull-up transistor responds to an input signal to charge and thus allow the output node to attain a boosted potential.

The plurality of pull-down transistors respond to an input signal to allow the output node to discharge and attain the first potential.

The substrate current limit circuit limits a substrate current flowing through the semiconductor substrate to reduce an average of a plurality of discharge operations of the output node for each pull-down transistor.

The substrate current limit circuit includes a control circuit cyclically selecting and driving a pull-down transistor among the plurality of pulldown transistors that allows the output node to discharge when the output node changes from a charged state to a discharged state for each operating cycle of the boosted-voltage drive circuit.

Thus, a main advantage of the present invention is that a discharge current can be distributed and thus flow through the plurality of pull-down transistors in one operation of the sub decode circuit to improve the reliability of the pull-down transistors.

Another advantage of the present invention is that a discharge current in the decode circuit for the redundant memory cells can be distributed and thus flow through the plurality of pull-down transistors to improve the reliability of the pull-down transistors.

Still another advantage of the present invention is that a discharge current can flow via a pull-down transistor cyclically selected from the plurality of the pull-down transistors for the plurality of operating cycles to improve the reliability of the pull-down transistors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
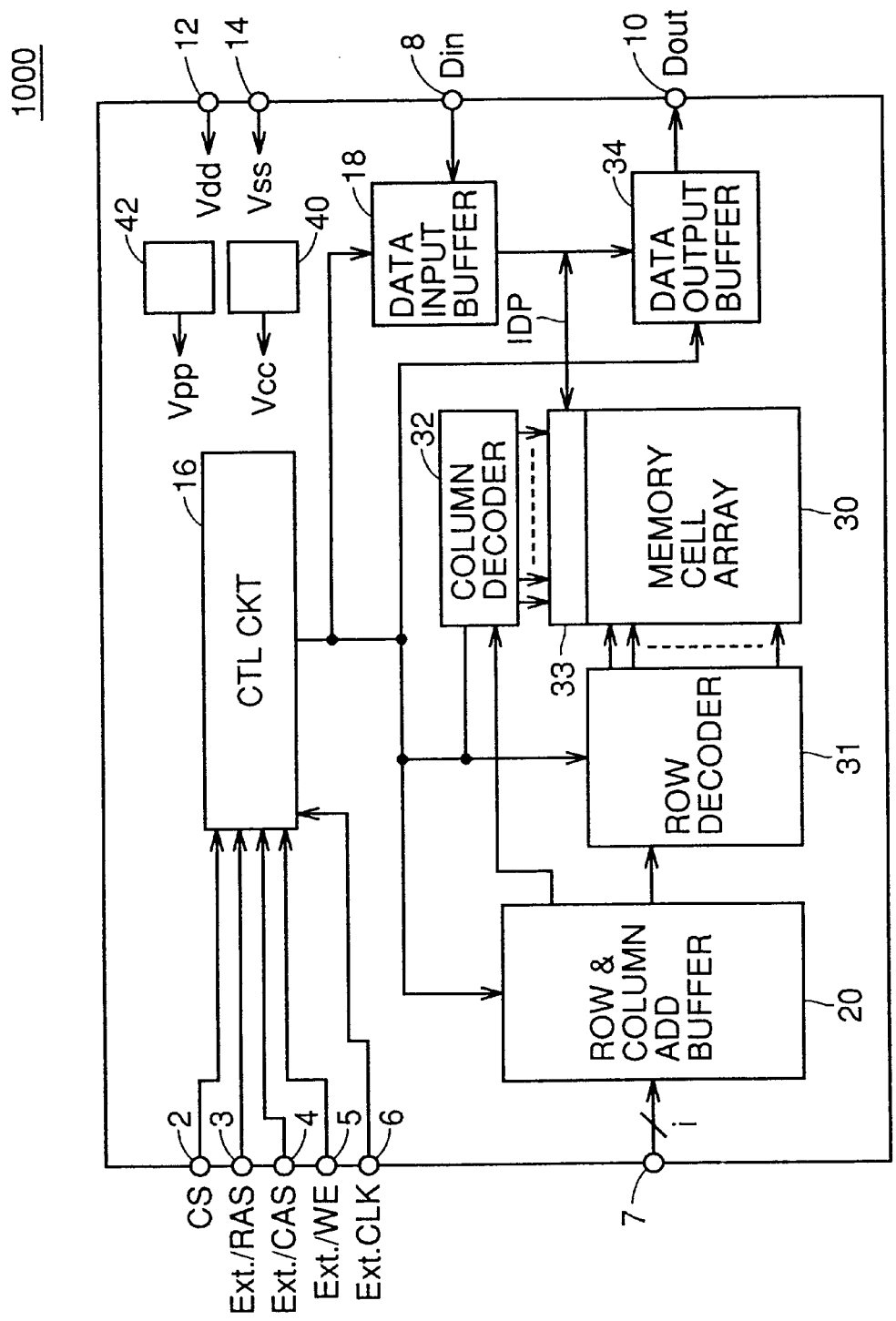
FIG. 1 is a schematic block diagram showing a configuration of a semiconductor memory device 1000 according to a first embodiment of the present invention.

FIG. 1 is a schematic block diagram for illustrating a configuration of a semiconductor memory device 1000 according to a first embodiment of the present invention.

Referring to FIG. 1, semiconductor memory device 1000 includes control signal input terminals 2, 4, an address input terminal 6, an input terminal Din which receives data, an output terminal Dout which outputs a data signal, a ground terminal 12, and a power supply terminal 14.

Semiconductor memory device 1000 also includes a control circuit 16, a row and column address buffer 20, a memory cell array 30, a row decode 31, a column decoder 32, a sense amplifier+input/output control circuit 33, a data input buffer 18, and a data output buffer 34.

Figure 39:
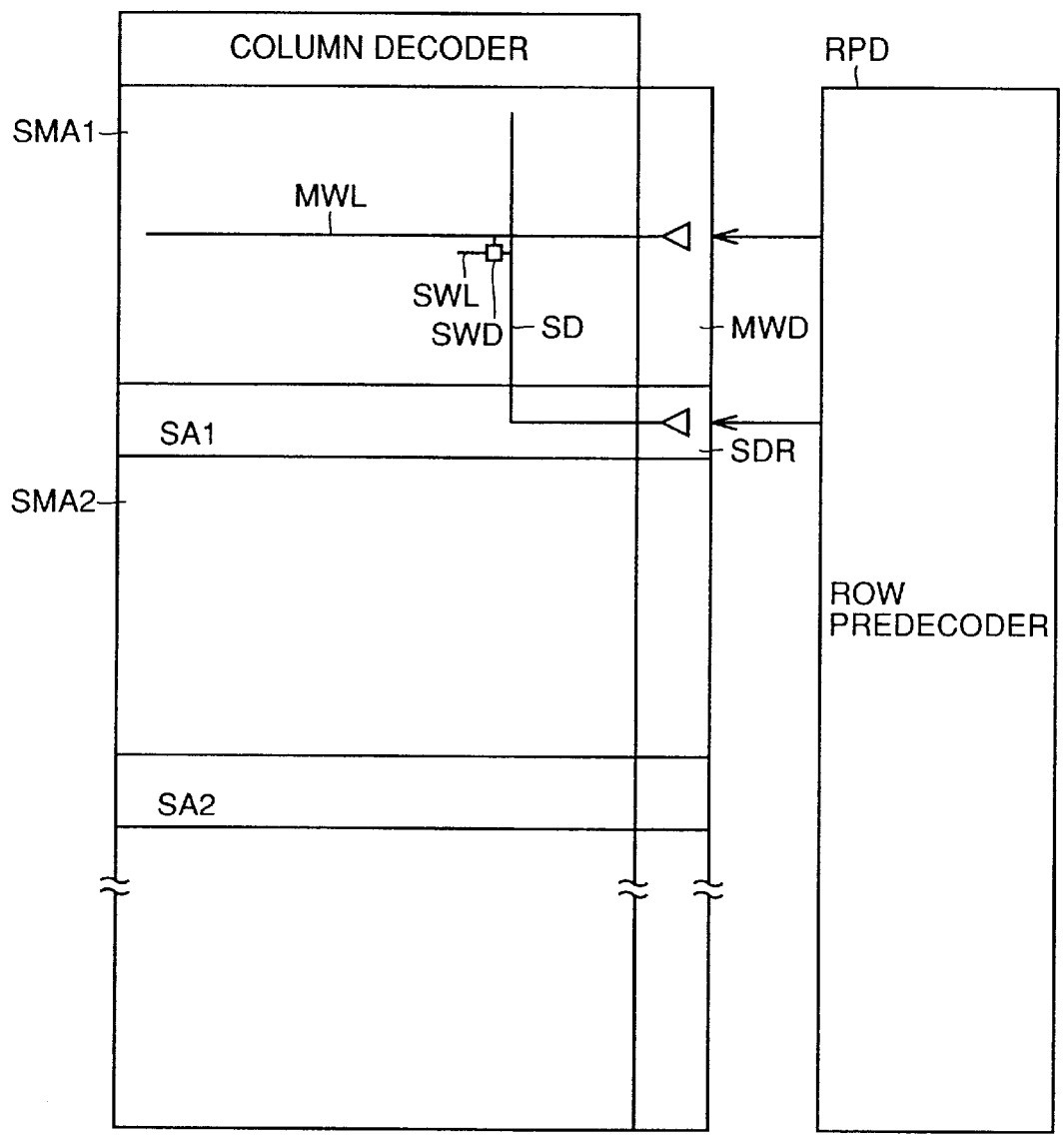
FIG. 39 is a schematic block diagram for illustrating a configuration of a memory cell array mat for a hierarchical word-line configuration.

Memory cell array 30 has a hierarchical word-line configuration which is different from that described with reference to FIGS. 39 and 40, as described hereinafter.

Control circuit 16 generates a control clock corresponding to a predetermined mode of operation depending on a row address strobe signal Ext./RAS, a column address strobe signal Ext./CAS and the like externally applied via control signal terminals 2, 4 to control the general operation of the semiconductor memory device.

Row and column address buffer 20 depends on externally applied address signals A0 to Ai (i is a natural number) to produce an address signal which is provided to row decoder 31 and column decoder 32.

A memory cell in memory cell array 32 that is designated by row decoder 31 and column decoder 32 communicates data with the external via sense amplifier+input/output control circuit 33 and data input buffer 11 or data output buffer 34 at input terminal Din or output terminal Dout.

Semiconductor memory device 1000 also includes an internal voltage-down converter 40 receiving an external power supply voltage Vdd and a ground potential GND to produce an internal down-converted potential Vcc supplied mainly to memory cell array 30, and a booster circuit 42 receiving external power supply voltage Vdd and ground potential GND to produce a potential Vpp boosted as compared to external power supply potential Vdd.

Figure 2:
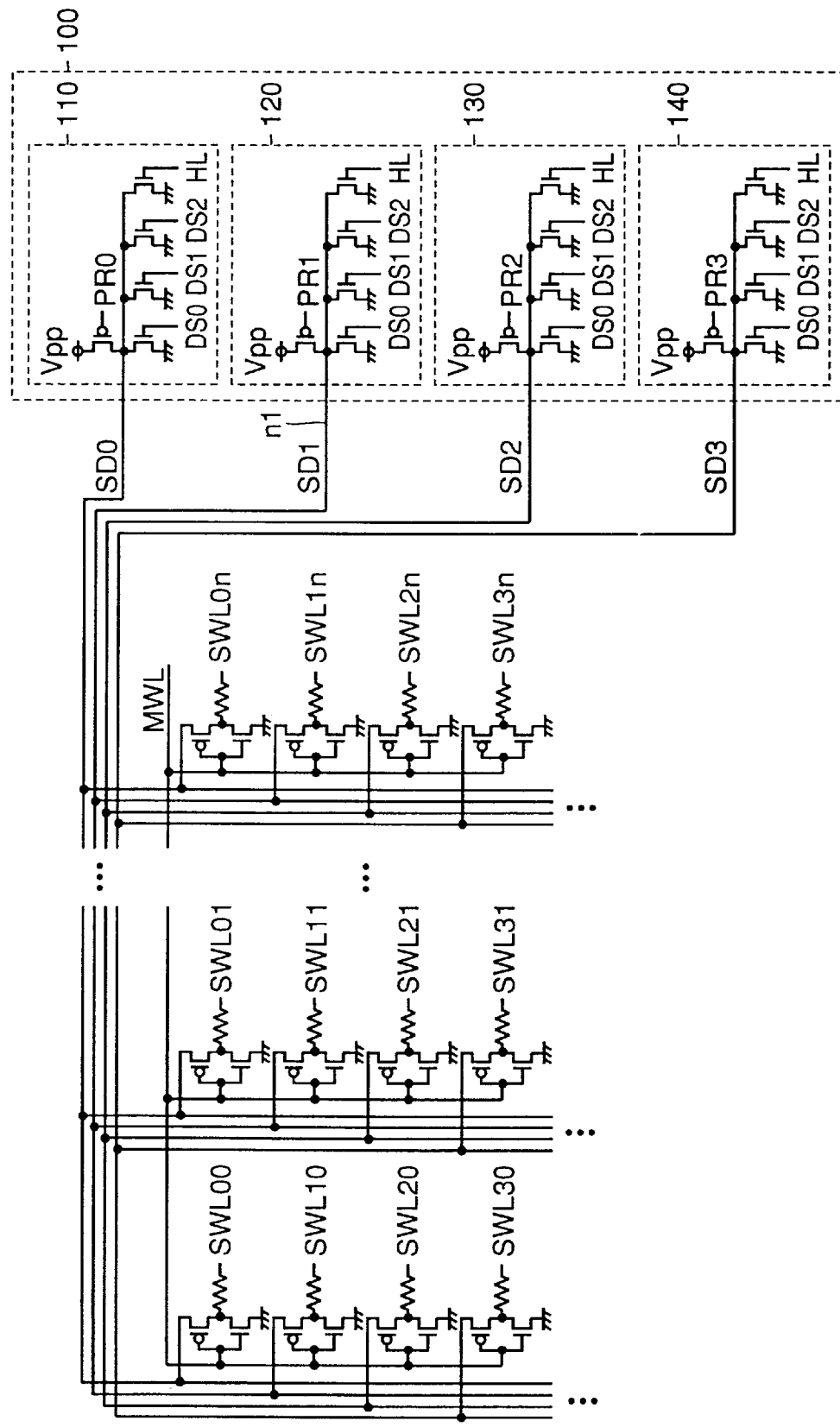
FIG. 2 is a schematic block diagram showing a hierarchical word-line configuration in a memory cell array 30.
Figure 40:
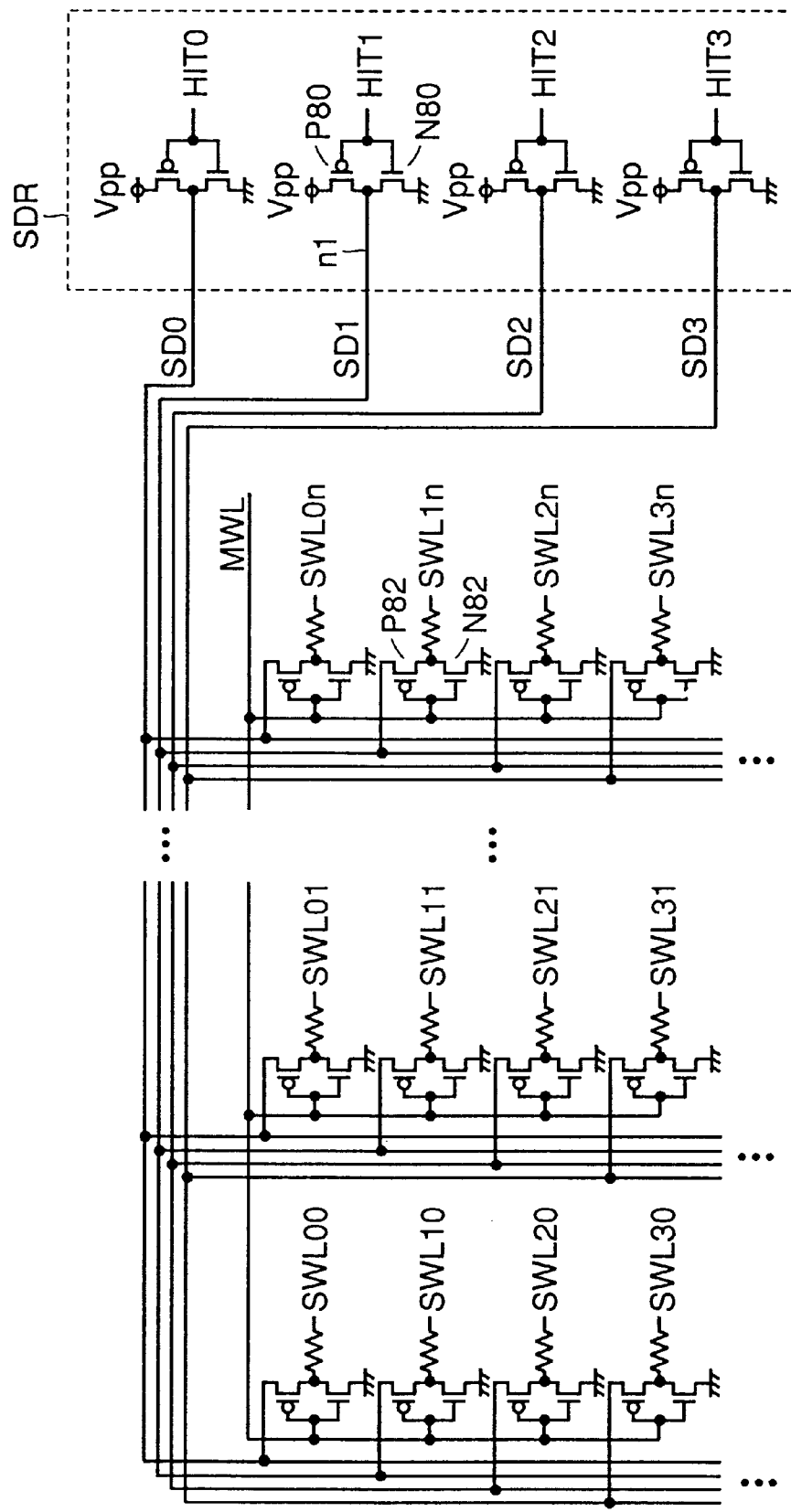
FIG. 40 is a circuit diagram for illustrating a configuration of sub decoder SDR and main word line MWL and sub word line SWL.
Figure 41:
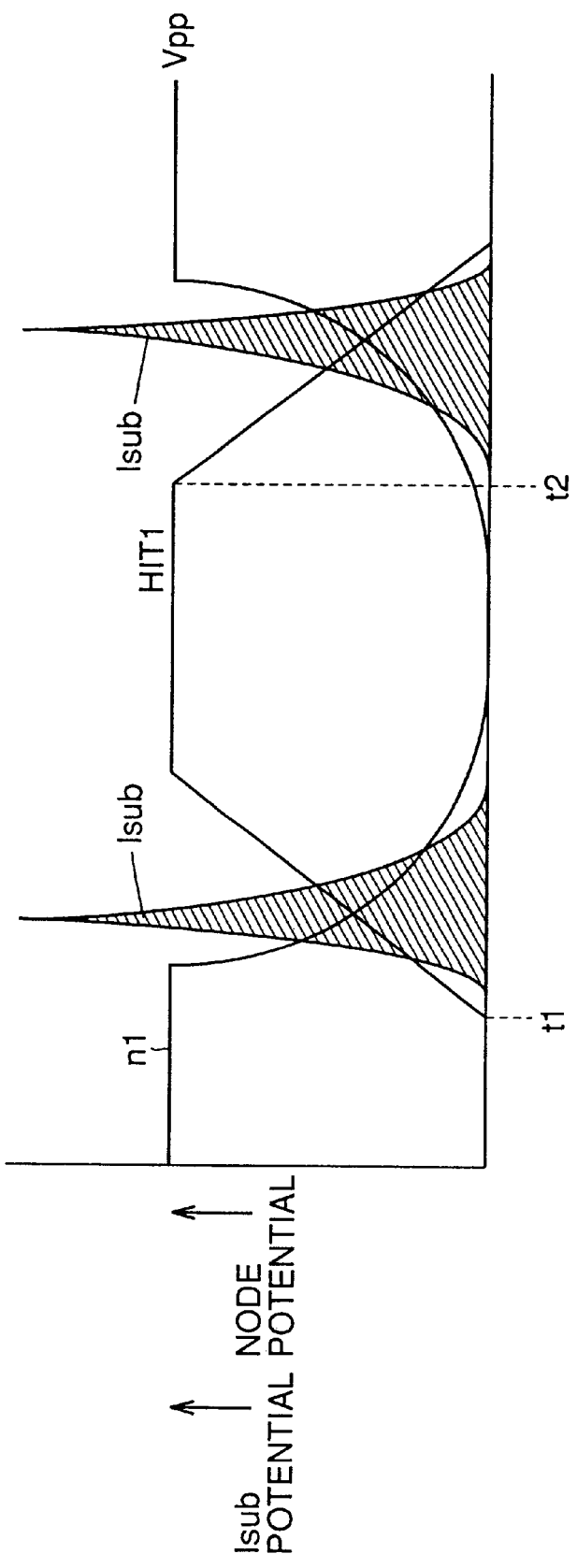
FIG. 41 is a time chart for representing substrate current Isub varied with time.

FIG. 2 is a schematic block diagram showing a hierarchical word-line configuration in memory cell array 30 shown in FIG. 1, as compared with the conventional, hierarchical word-line configuration shown in FIG. 40.

The hierarchical word-line configuration shown in FIG. 2 differs from the conventional, hierarchical word-line configuration shown in FIG. 40 in the configuration of a sub decoder 100. The rest of the configuration is similar to that of the conventional, hierarchical word-line configuration and like portions are denoted by like reference characters and the description thereof will not be repeated.

Sub decoder 100 includes e.g. drive circuits 110, 120, 130, 140 provided for sub decode lines SD0, SD1, SD2, SD3, respectively.

Figure 3:
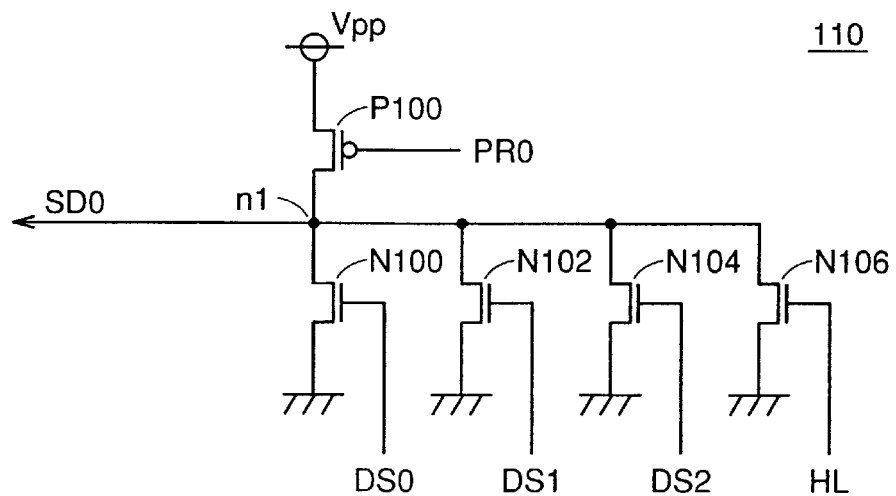
FIG. 3 is a circuit diagram showing a configuration of the drive circuit 110 shown in FIG. 2.

FIG. 3 is a circuit diagram showing a configuration of drive circuit 110 shown in FIG. 2.

Drive circuits 120–140 are basically similar in configuration to drive circuit 110, although they receive different signals and drive different sub decode lines.

Drive circuit 110 includes a p-channel MOS transistor P100 provided between boosted potential Vpp and an output node n1 connected to sub decode line SD0 and having a gate potential controlled by a signal HIT0, and n-channel MOS transistors N100, N102, N104 and N106 provided between node N1 and ground potential GND.

Transistors N100, N102, N104 and N106 receive signals DS0, DS1, DS2 and HL at their respective gates.

Figure 4:
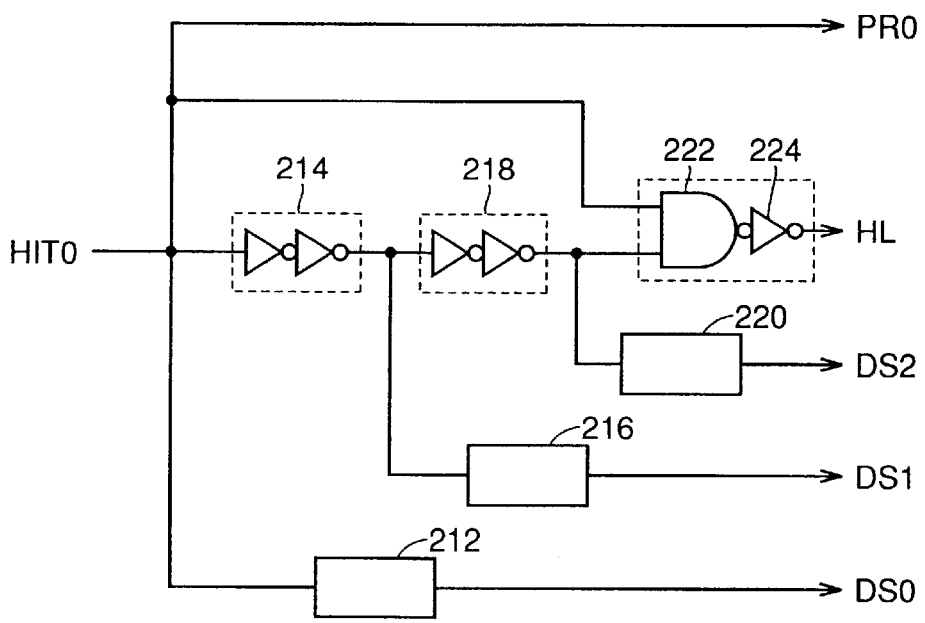
FIG. 4 is a schematic block diagram showing a configuration of a control circuit 210.

FIG. 4 is a schematic block diagram showing a configuration of a control circuit 210 which outputs signals PR, DS0–DS2 and HL for controlling an operation of drive circuit 110 shown in FIG. 3.

Drive circuit 210 receives signal HIT0 and outputs signal HIT0 as a precharge signal PR0. Control circuit 210 includes a one-shot pulse generation circuit 212 receiving signal HIT0 and outputting signal DS0 the pulse width of which has a predetermined period of time, a delay circuit 214 receiving signal HIT0, delaying the received signal HIT0 for a predetermined period of time and outputting the delayed signal HIT0, a one-shot pulse generation circuit 216 receiving an output from delay circuit 214 and producing signal DS1 the pulse width of which has a predetermined period of time, a delay circuit 218 receiving an output from delay circuit 214, delaying the received output for predetermined period of time and outputting the delayed output, a one-shot pulse generation circuit 220 receiving an output from delay circuit 218 to produce signal DS2 the pulse width of which has a predetermined period of time, and an NAND circuit 222 and an inverter 224 receiving signal HIT0 and the output from delay circuit 218 for outputting signal HL.

Figure 5:
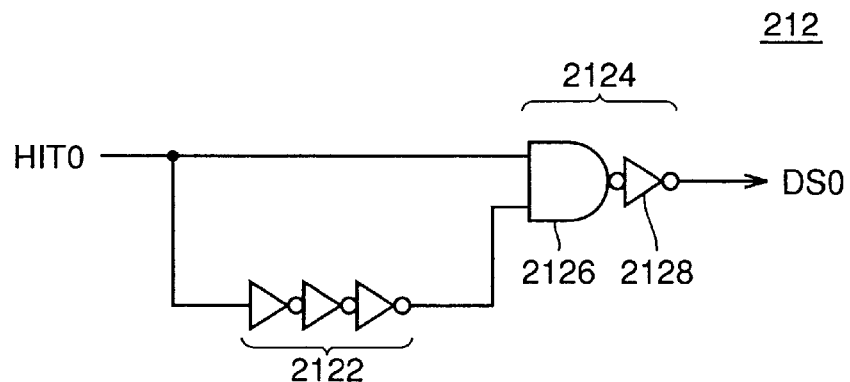
FIG. 5 is a circuit diagram for illustrating a configuration of a one-shot pulse generation circuit 212.

FIG. 5 is a circuit diagram for illustrating a configuration of one-shot pulse generation circuit 212 shown in FIG. 4.

The other one-shot pulse generation circuits 216 and 220 are basically similar in configuration to one-shot pulse generation circuit 212.

One-shot pulse generation circuit 212 includes a delay circuit 2122 receiving and delaying input signal HIT0 for a predetermined period of time and then inverting and outputting the delayed input signal HIT0, and an NAND circuit 2124 receiving an output from delay circuit 2122 and signal HIT0 to output signal DS0.

It should be noted that delay circuit 2122 includes e.g. a train of inverters connected in series in an odd number of stages and AND circuit 2124 includes an NAND circuit 2126 and a inverter 2128 receiving and inverting an output from NAND circuit 2126.

Figure 6:
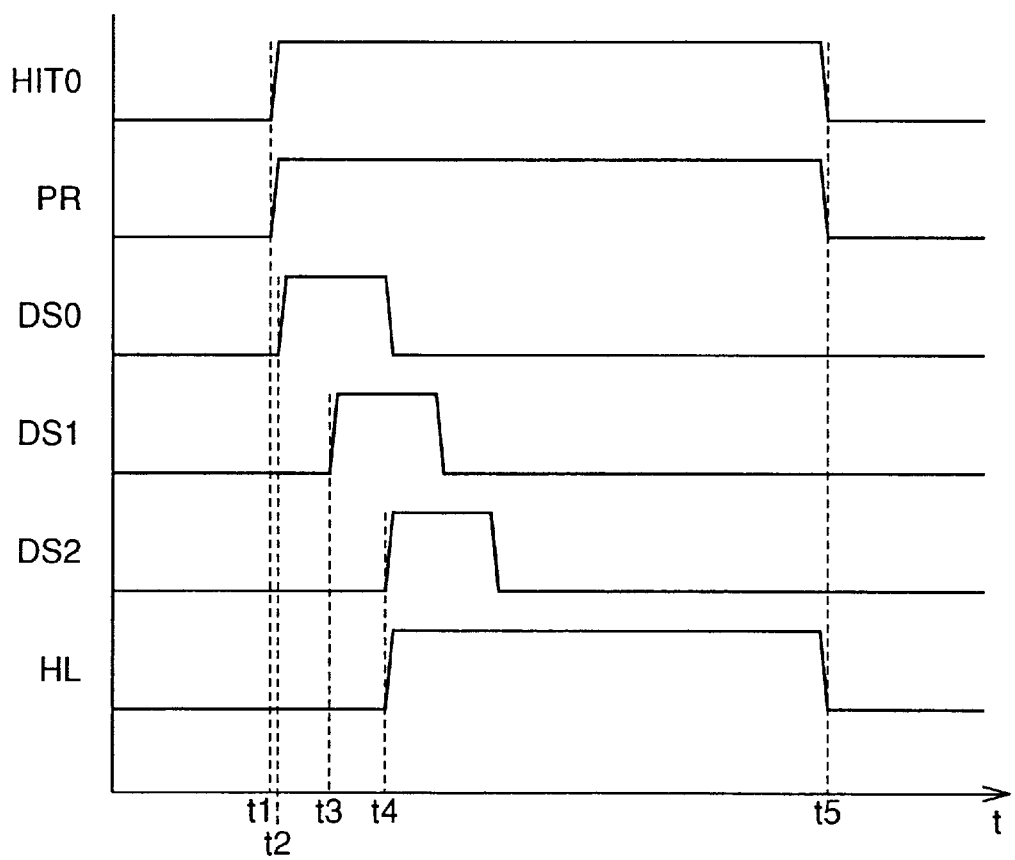
FIG. 6 is a time chart for representing an operation of control circuit 210.

FIG. 6 is a time chart for representing an operation of control circuit 210 shown in FIG. 4.

At time t1, signal HIT transitions to potential level Vpp and precharge signal PR responsively rises from ground potential GND to potential level Vpp.

At time t2, one-shot pulse generation circuit 212 responds to the low-to-high transition of signal HIT0 to output signal DS0 the pulse width of which has a predetermined period of time. Responsively, transistor N100 is turned on to allow node N1 to discharge for the predetermined period of time.

At time t3, signal DS1 is subsequently activated and maintained in an active state for a predetermined period of time. Responsively, transistor N102 is turned on to allow node N1 to discharge for the period of the active state.

At time t4, signal DS2 is placed in an active state which is then maintained for predetermined period of time τ. Responsively, transistor N104 is turned on to allow node N1 to discharge.

At time t4, hold signal HL is also placed in an active state which is maintained until signal HIT0 is placed in an inactive state, i.e. time t5.

That is, a predetermined time lag is applied to transistors N100, N102, N104 successively to allow node n1 to discharge, and its potential level is eventually maintained by transistor N100 maintained in an on state for the period from time t4 through time t5.

Figure 7:
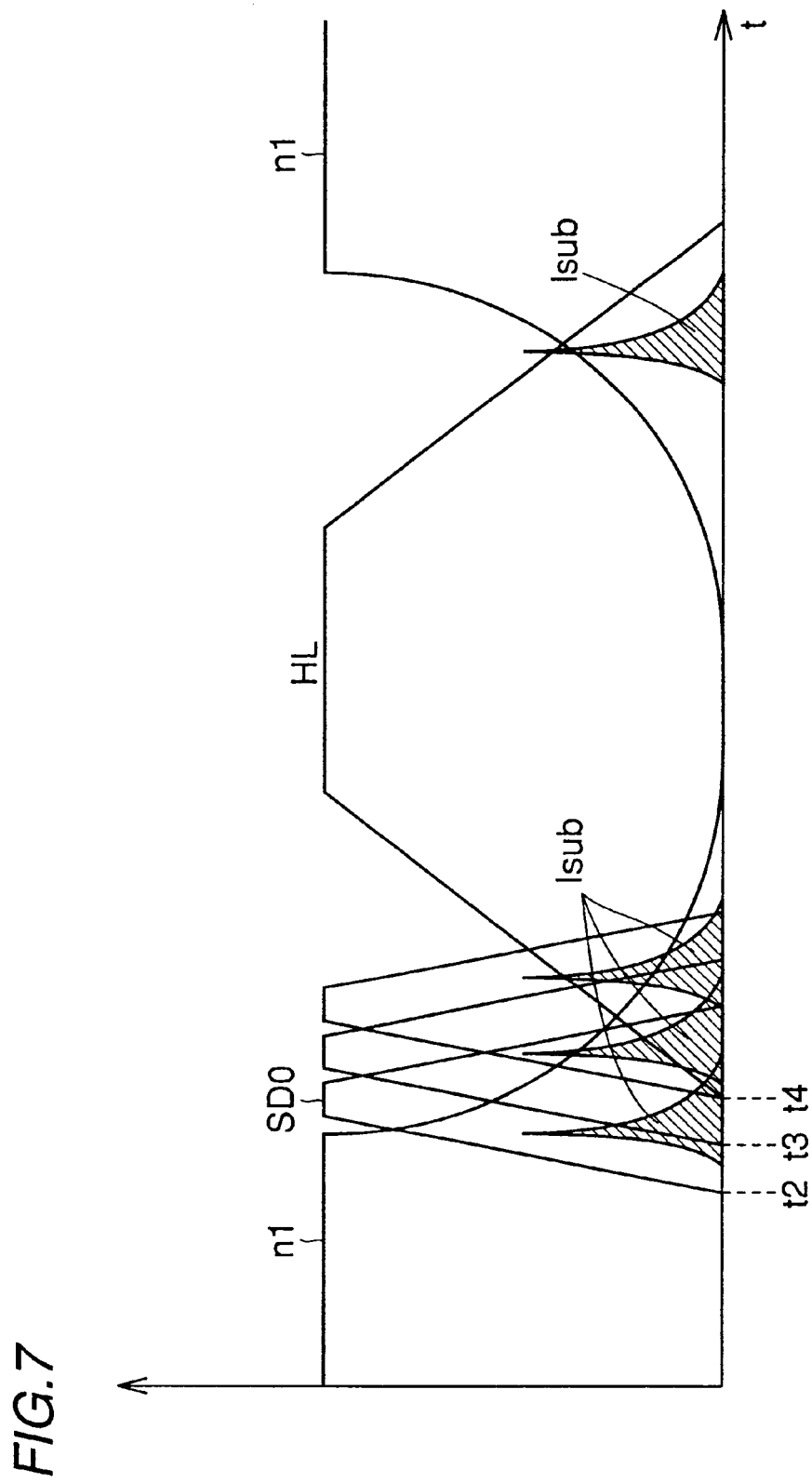
FIG. 7 is a time chart for representing a substrate current flowing in drive circuit 110 that varies with time.

FIG. 7 is a time chart representing the substrate current flowing through drive circuit 110 operating as described above, the potential level of node n1, and signals DS0–DS2 and HL varying with time.

As described above, substrate current Isub flows when signal DSO transitions to an active state at time t2 and transistor N100 responsively allows node n1 to discharge. However, the period during which transistor N100 is turned on is shorter than that during which transistor N80 in the conventional sub decoder shown in FIG. 40 is turned on. Thus, current Isub flowing through the substrate of transistor N100 is smaller than conventional.

Similarly, current Isub flowing in the substrate of transistor N102 and that flowing in the substrate of transistor N104 when signals DS1 and DS2 are active, respectively, are smaller than conventional. More specifically, the discharge current which has been conventionally flown in conventional sub decoder SDR only via transistor N80 flows in the FIG. 3 drive circuit 110 of the first embodiment via three distributed transistors to limit the peak value of substrate current Isub.

As described above, hot carrier generation is greater when charged node n1 discharges and attains the ground potential level. Thus, the configurations as shown in FIGS. 3 and 4 improve the reliability of the n-channel MOS pull-down transistors in the sub decoder.

Furthermore, the current driving capability of n-channel MOS transistor N106 to maintain the discharge level only requires any magnitude that is sufficient to maintain the potential level. Thus, the n-channel MOS transistor may have small channel width and is not required to have fast operating speed and the n-channel MOS transistor can thus be set to have long channel length. The long channel length can restrain influences of impact ionization when transistor N106 allows the discharging or transistor P100 allows the charging.

Second Embodiment

Figure 8:
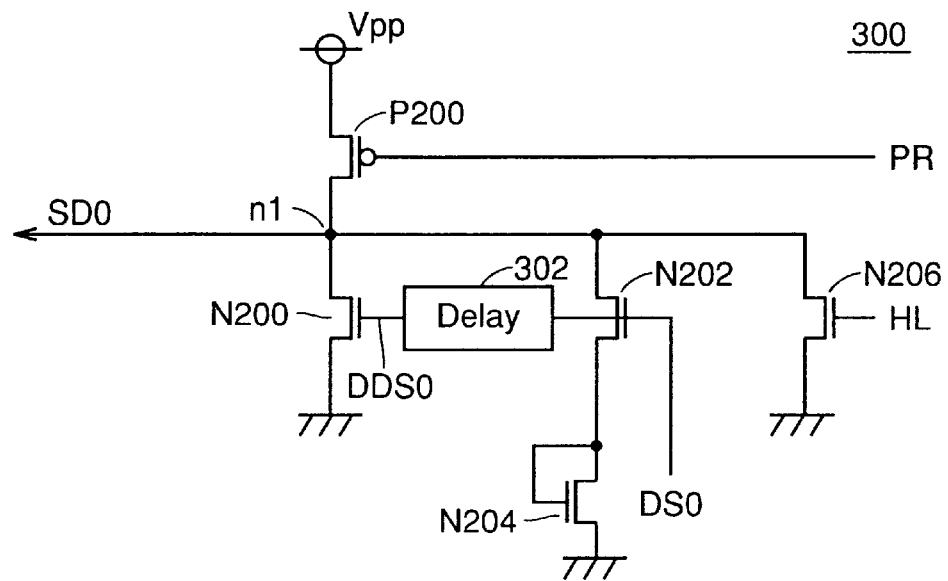
FIG. 8 is a schematic block diagram showing a configuration of a drive circuit 300 in a sub decoder according to a second embodiment of the present invention.

FIG. 8 is a schematic block diagram showing a configuration of a drive circuit 300 in a sub decoder according to a second embodiment of the present invention, as compared with FIG. 3 showing the configuration of drive circuit 110 according to the first embodiment.

Drive circuit 300 includes a p-channel MOS transistor P200 and an n-channel MOS transistor N200 connected in series between a boosted potential Vpp and a ground potential GND. Transistor P200 receives a signal PR at its gate.

Drive circuit 300 also includes n-channel MOS transistors N202 and N204 connected in series between an output node nI and ground potential GND.

The gate of transistor N202 is driven by a signal DS0. Transistor N204 has its gate and drain connected together and the source receiving ground potential GND. Thus, transistor N204 operates as a diode with the direction from output node nI towards ground potential GND as the forward direction.

Drive circuit 300 also includes a delay circuit 302 receiving and delaying signal DS0 for a predetermined period of time and providing the delayed signal DS0 to the gate of transistor N200, and an n-channel MOS transistor N206 connected between output node n1 and ground potential GND and receiving a signal HL at its gate.

Thus, in drive circuit 300, transistor N202, which has its discharge level limited by transistor N204, initially activated to start to allow output node n1 to discharge, as described hereinafter.

Then, pulse signal DS0 is transmitted via the delay element and transistor N200 is turned on to allow output node n1 to discharge.

At the initial discharge, the discharging transistor N202 has its source level limited. Thus, transistor N202 has its gate-source and drain-source voltages reduced and this results in a limited magnitude of substrate current Isub generated at transistor N202.

Furthermore, the current driving capability of n-channel MOS transistor N206 to maintain the discharge level may be any magnitude that is sufficient to maintain the potential level. Thus, the n-channel MOS transistor may have small channel width and is not required to operate rapidly and the n-channel MOS transistor can thus be set to have long channel length. The long channel length can restrain influences of impact ionization when transistor N206 allows the discharging or transistor P200 allows the charging.

Figure 9:
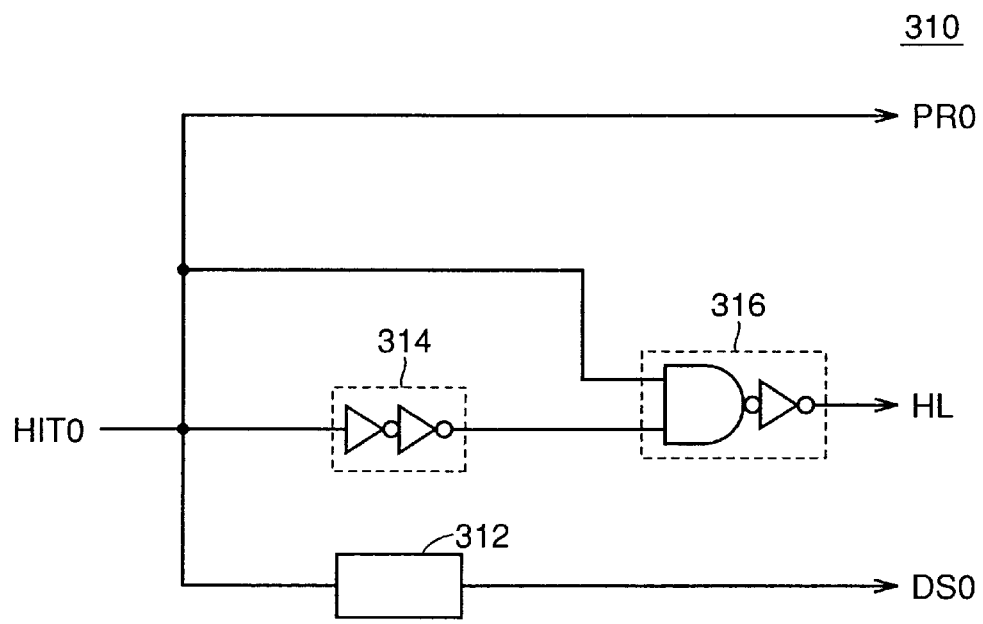
FIG. 9 is a view for illustrating a configuration of a control circuit 310.

FIG. 9 is a view for illustrating a configuration of a control circuit 310 for producing signals SD0 and HL shown in FIG. 8, as compared with FIG. 4 of the first embodiment.

Control circuit 310 receives a signal HIT0 and outputs it as a signal PR0.

Control circuit 310 also includes a one-shot pulse generation circuit 312 for receiving signal HIT0 and outputting signal DS0, a delay circuit 314 for delaying signal HIT0 for a predetermined period of time and outputting the delayed signal HIT0, and an AND circuit 316 receiving an output from delay circuit 314 and signal HIT0 to output signal HL.

One-shot pulse generation circuit 312 is similar in configuration to the first embodiment one-shot pulse generation circuit 212 described with reference to FIG. 5.

Figure 10:
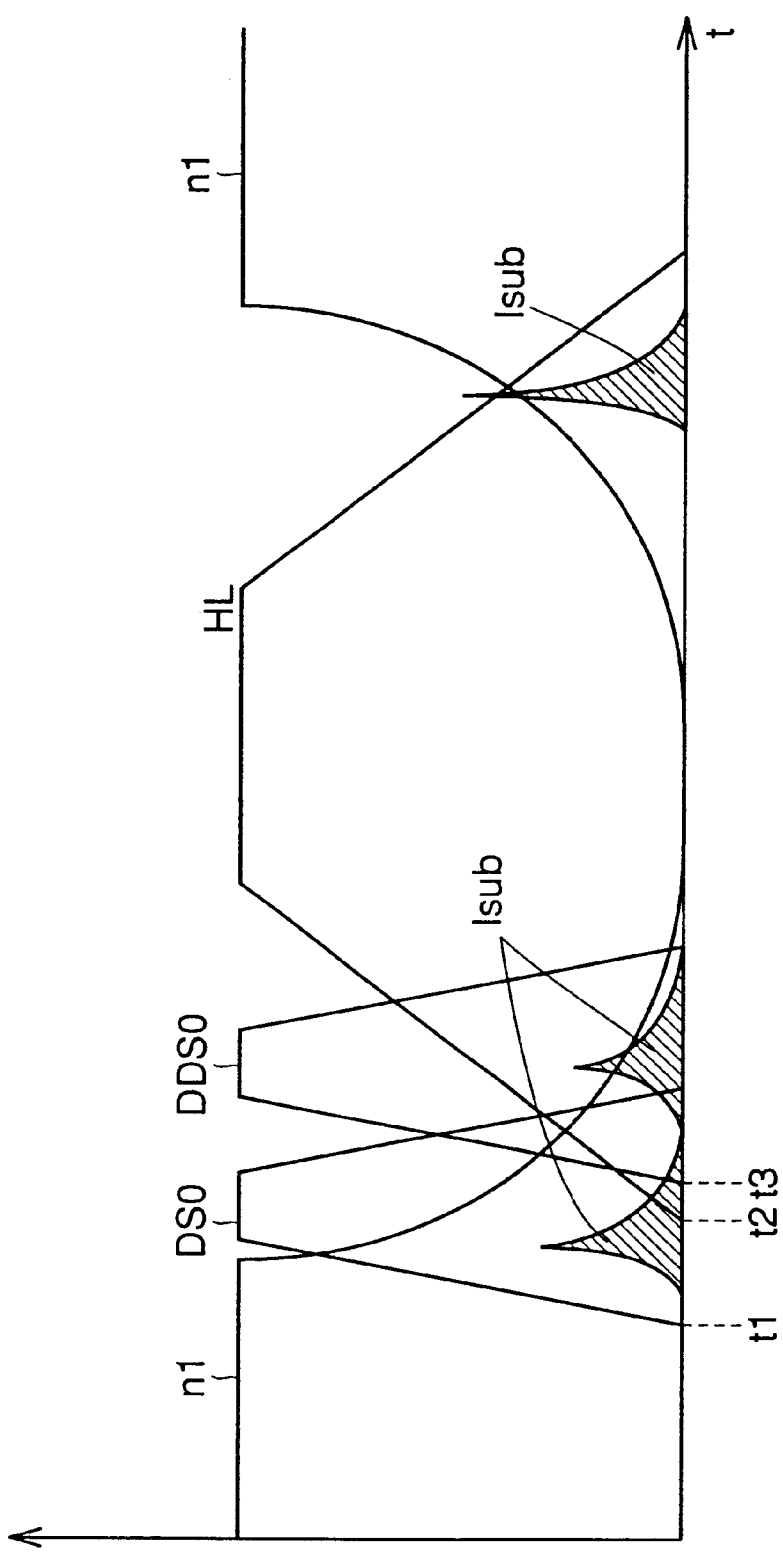
FIG. 10 is a time chart for presenting an operation of drive circuit 300 shown in FIG. 8.

FIG. 10 is a time chart for representing an operation of drive circuit 300 shown in FIG. 8.

At time t1, signal DS0 transitions to an active state. Responsively, substrate current Isub flows when node n1 discharges via transistor N202. However, the period during which transistor N202 is turned on is shorter than that during which transistor N80 in the conventional sub decoder shown in FIG. 40 is turned on. Thus, current Isub flowing in the substrate of transistor N202 is smaller than conventional.

During the active period of a signal DDS0 output from delay circuit 302 that is started at time t3, current Isub flowing in the substrate of transistor N200 is also smaller than conventional.

Thus, n-channel MOS pull-down transistors in the sub decoder according to the second embodiment also have an improved reliability.

Third Embodiment

Figure 11:
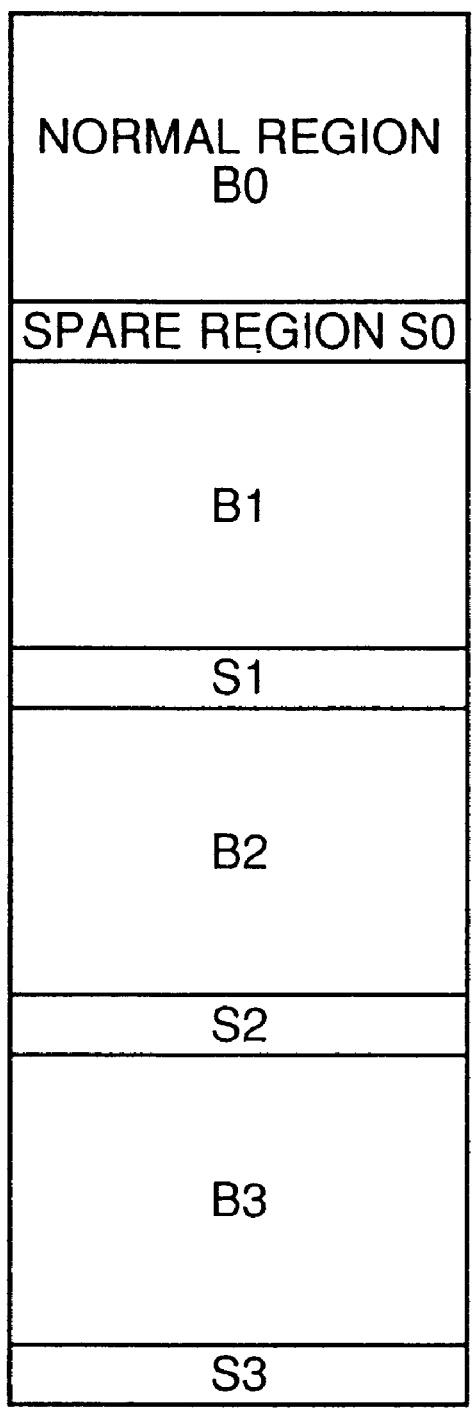
FIG. 11 shows a configuration of a DRAM memory array according to a third embodiment of the present invention.

FIG. 11 shows a configuration of a DRAM memory array according to a third embodiment of the present invention.

The memory array shown in FIG. 11 is divided in four banks. In each memory array are present a regular memory cell region (or a normal region) and a redundant memory cell region (or a spare region). For example, a spare region S0 is provided for a normal region B0.

Figure 12:
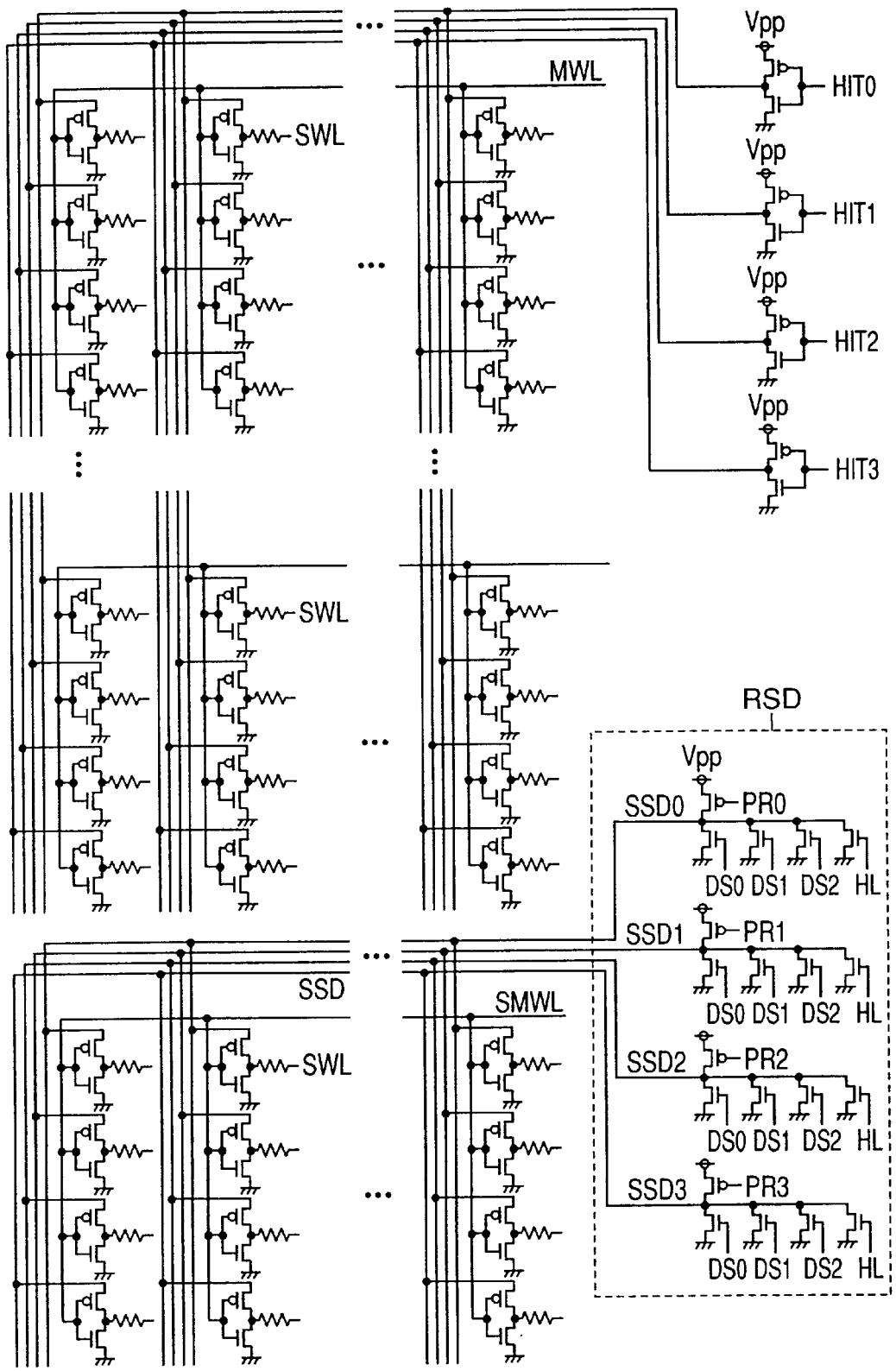
FIG. 12 is a schematic block diagram for illustrating a hierarchical word-line configuration provided for a memory array.

FIG. 12 is a schematic block diagram for illustrating a hierarchical word-line configuration provided for such a memory array.

For a word-line configuration in a normal region, there are provided in a direction of a word line a plurality of divided, sub word lines (SWL) which receive a main select signal from a common, main word line (MWL). One main word line MWL selects four sub word lines SWLs as one set. Sub decode lines SD0 to SD3 are provided to select one of the four sub word lines SWLs.

A spare region is basically similar to the normal region, having a hierarchical word-line configuration of main and sub word lines.

In order to activate a desired sub word line SWL rapidly, it is desirable to initially activate a sub decoder line and then activate main word line MWL, since simultaneous activation of main word line MWL and a sub decode line results in the sub decode line, which has larger parasitic capacitance, being delayed in activation. Thus, it is necessary to activate the sub decode line at an earlier timing. For a flexible, redundant configuration having a spare memory sub block, however, it is not until redundancy determination is provided that a corresponding sub decode line can be selected, so that it is generally different to previously activate the sub decode line.

According to the hierarchical word-ine configuration according to the third embodiment, the respective potential levels of sub word lines, which have large capacitance, are initially raised to some degree and only a sub decode line required for selection is then allowed to be activated, attaining the aimed value.

In other words, sub decode signal lines in a normal region are divided from those in a spare region. When a bank is activated, the divided, sub decode lines belonging to the both regions are activated simultaneously.

That is, a sub decoder belonging to a normal region in FIG. 12 is similar in configuration to the conventional sub decoder shown in FIG. 40.

By contrast, sub decoder RSD provided for a spare region is different from the sub decoder in the normal region, as described hereinafter, having a configuration similar to that of sub decoder 100 according to the first embodiment.

As described above, signal HIT1 or the like is activated in response to a signal from a row predecoder. Responsively, sub decode line SD1 for a normal region and a sub decode line SSD1 for a spare region are both activated and then a hit/miss signal H/M indicative of a result of redundancy determination that is delayed by a predetermined period of time is input so that a selected one of lines SD1 and SSD1 only provides a read operation.

In this case, only n-channel MOS transistors of relatively small size are rendered non-conductive, and since substrate current Isub flowing via each n-channel MOS transistor is small, influences of impact ionization are also reduced.

In inactivating a selected sub decode line, one-shot pulse signals DS0 to DS2 are successively activated in e.g. sub decoder RSDR in a spare region in response to signal HIT1 that is inactivated (or transitions to Vpp), and responsively sub decode line SSD1 is discharged and n-channel MOS transistor N306 is maintained in an on state.

In general, in the configuration as described above a sub decode line in a normal region is considered to be activated at the duty ratio corresponding to the ratio of one sub decode line to all of the sub decode lines contained in the normal region. Thus, a pull-down n-channel MOS transistor in a sub decoder for a normal region is less affected by impact ionization than pull-down n-channel MOS transistor M306 or the like for a sub decode line for a spare region.

A sub decode line of a spare region is more affected by impact ionization than that of a normal region, since a spare region has a small number of sets of sub decode lines. Accordingly, the configuration of a sub decode line drive circuit for the normal region can be similar to a conventional configuration while the configuration of sub decodet RSD for the spare region can be configured according to the first embodiment as shown in FIG. 3 to reduce degradation of the reliability of the pull-down n-channel MOS transistors in the sub decoder that is caused by impact ionization.

The configuration of sub decoder RSD for a spare region can be that using the FIG. 8 drive circuit according to the second embodiment.

Figure 13:
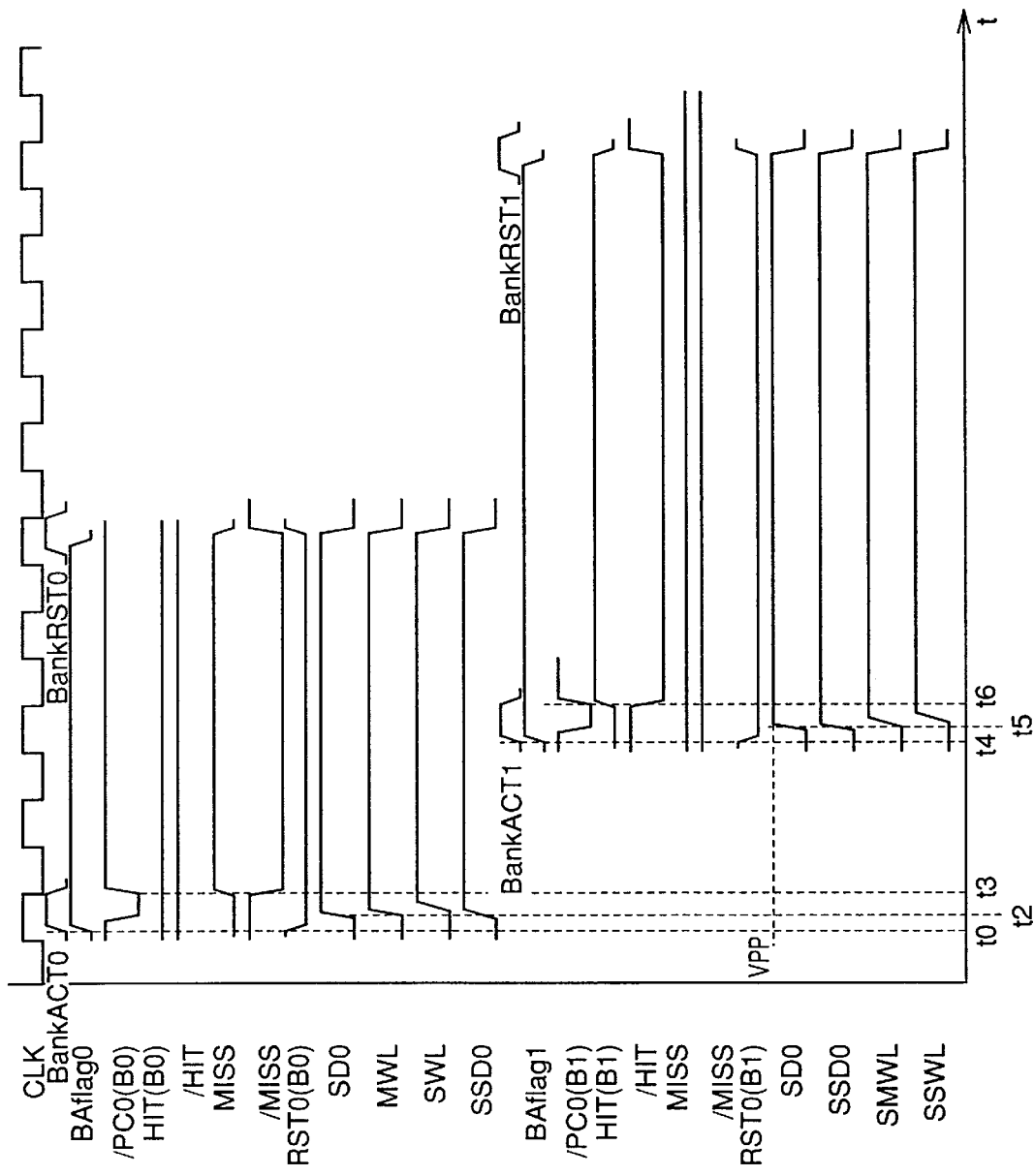
FIG. 13 is a time chart for representing an operation of a sub decoder circuit shown in FIG. 12.

FIG. 13 is a time chart for representing an operation of the sub decoder circuit shown in FIG. 12.

Initially at time t0 an activation signal bank ACT0 for a bank 0 is input to activated a flag BAflag0. Responsively, according to a result obtained from decoding an address corresponding to a sub word line SWL select signal a sub decode line, e.g. sub decode line SD0, responds to temporarily activated signal DS0 and inactivated signal PR at time t2 to be activated, attaining potential level Vpp. Simultaneously, associated sub decode line SSD0 for a spare region also attains potential level Vpp and is thus activated.

When the redundant determination for bank 0 at time t3 results in activated signal MISS and indication is provided to select a regular row of memory cells, a read operation is performed for the regular row of memory cells thereafter.

At time t4, a bank activation signal for bank 1 or a signal BankACT1 is input to activate a flag Baflag1. Responsively, according to a result obtained by decoding an address corresponding to a sub word line SDL select signal, sub decode line SD0 for a normal region responds to temporarily activated signal DS0 to attain potential level Vpp and be thus activated at time t5. Simultaneously, sub decode line SSD0 for a spare region also attains potential level Vpp and is thus activated.

In bank 1, a selected word line corresponds to a defective address. Thus, hit signal HIT (B1) in bank 1 is activated at time t6.

While sub decode line SD0 for the normal region and sub decode line SSD0 for the spare region simultaneously attain the potential Vpp level and is thus activated, in response to activated signal HIT a sense operation is not started in the normal region and a read operation is not provided in the normal region. By contrast, only in the spare region are performed a sense operation and a subsequent read operation.

The configuration as described above can maintain rapid operation and also improve the reliability of a sub decoder for a spared region (a redundant region).

It should be noted that the configuration of sub decoder RSD for a spare region can be that employing the FIG. 14 drive circuit according to the fourth embodiment, as described below.

Fourth Embodiment

Figure 14:
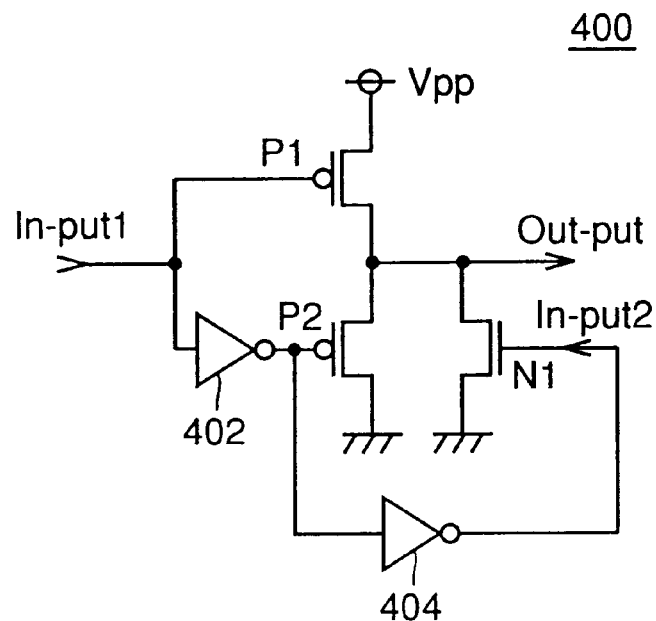
FIG. 14 is a circuit diagram showing a configuration of a drive circuit 400 according to a fourth embodiment of the present invention.

FIG. 14 is a circuit diagram showing a configuration of a drive circuit 400 according to a fourth embodiment of the present invention.

In drive circuit 400, p-channel MOS transistors P1 and P2 are connected between power supply potential Vpp and ground potential GND.

The gate of transistor P1 is controlled by an input signal IN, and the gate potential of transistor P2 is controlled by an output from an inverter 402 which receives and inverts signal IN.

At an output node n1 an n-channel MOS transistor N1 is provided in parallel with p-channel MOS transistor P2. The gate of transistor N1 is controlled by an output from an inverter 404 which receives and inverts an output from inverter 402.

The carrier of a p-channel MOS transistor is holes, which is low in mobility than electrons. Thus, it is higher in resistance to hot carrier if it is formed according to the same transistor design rule at the same operation voltage. Thus, p-channel MOS transistors P1 and P2 are adapted to be employed for both pull-up and pull-down during an initial period of a logic switching operation.

When the input signal switches from a high level to a low level, p-channel MOS transistor P1 pulls the output node up to high power supply level Vpp, as with a normal CMOS driver, while the gate of p-channel MOS transistor P2 receives a high-level signal and the gate of n-channel MOS transistor N1 receives a low-level signal so that transistors P2 and N1 are both turned off.

When the input signal switches from the low level to a high level, transistor P1 is turned off and transistors P2 and N1 are turned on. Thus, output node n1 is pull down to the ground potential.

Figure 15:
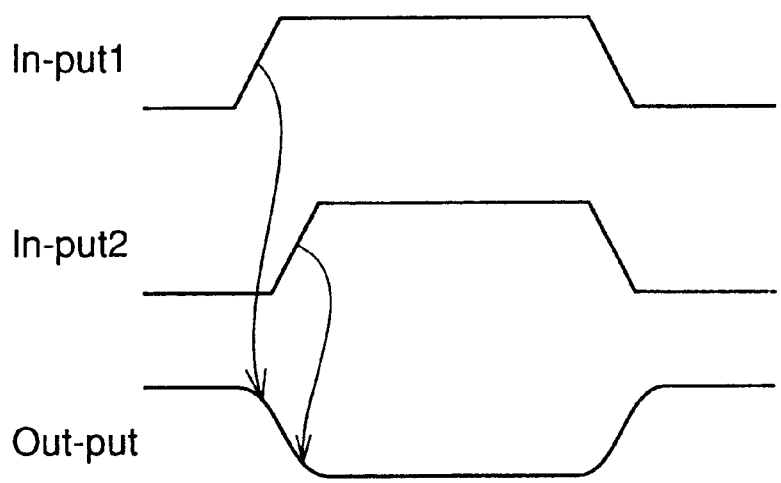
FIG. 15 is a time chart for presenting an operation of drive circuit 400 shown in FIG. 14.

FIG. 15 is a time chart for representing an operation of drive circuit 400 shown in FIG. 14.

A low-to-high transition of the signal input to n-channel MOS transistor N1 delays as compared to the respective timings at which p-channel MOS transistors P1 and P2 transition. Consequently, the potential of the output node is initially lowered by p-channel MOS transistor P2 and the gate node of n-channel MOS transistor N1 then attains an active level to turned on transistor N1. This overcomes the problem of the reliability degraded due to hot carrier.

It should be noted that for the above configuration the signal level for the gate potential of an n-channel MOS transistor may be lower than the power supply potential of boosted potential Vpp. More specifically, the gate amplitude of n-channel MOS transistor NI may be e.g. internal power supply level Vdd lower than boosted potential Vpp, as long as it is a potential level which turns on n-channel MOS transistor N1.

Fifth Embodiment

Figure 16:
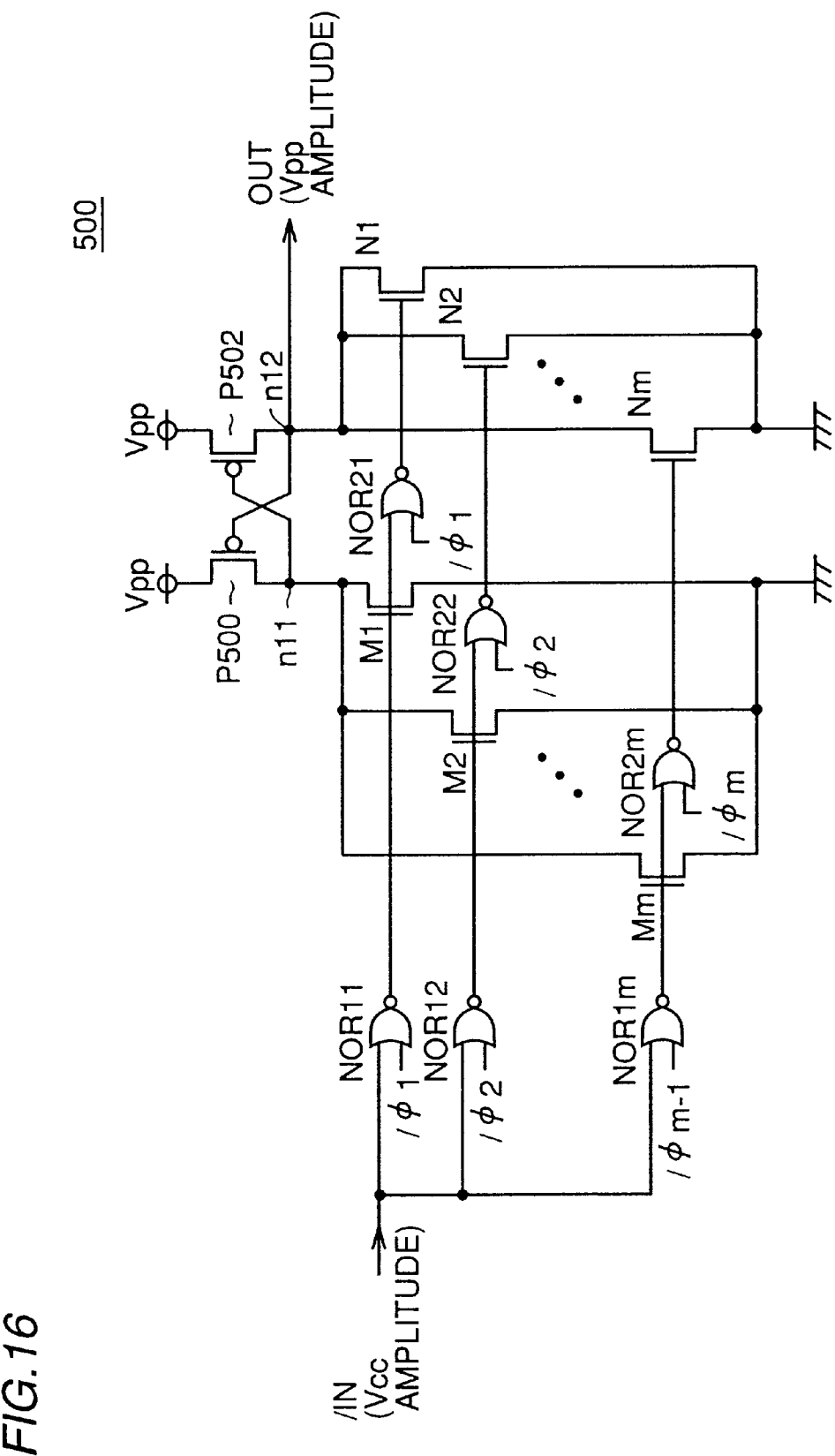
FIG. 16 is a circuit diagram for illustrating a configuration of a level shifter 500 according to a fifth embodiment of the present invention.

FIG. 16 is a circuit diagram for illustrating a configuration of a level shifter 500 according to a fifth embodiment of the present invention.

Level shifter 500 according to the fifth embodiment includes p-channel MOS transistor P500 provided between a node n11 and boosted potential Vpp, and a p-channel MOS transistor P502 provided between a node nl2 and boosted potential Vpp. The gate and drain of transistor P500 are cross-coupled with the drain and gate of transistor P502.

Level shifter 500 also includes a train of m n-channel pull-down transistors M1, M2, . . . , Mm provided in parallel between node n11 and the ground potential, and a train of m n-channel pull-down transistors N1, N2, . . . , Nm provided in parallel between node n12 and the ground potential.

For each cycle for which a block in which the level shifter is present is selected, the n-channel pull-down transistor operating for node nil changes from transistor M1→transistor M2→ . . . →transistor Mm→transistor M1→transistor M2→ . . . . Following this change, the n-channel pull-down transistor operating for node n12 changes cyclically from transistor N1→transistor N2→ . . . →transistor Nm→transistor N1→transistor N2→ . . . , successively.

The configuration as described above allows the actual operation frequency of an individual n-channel MOS transistor to be reduced to 1/m. Thus, the longevity of an n-channel pull-down transistor operating with boosted voltage Vpp can be increased by m times according to simple calculation.

The operating n-channel pull-down transistor cyclically alternates in response to inverted versions [/$\phi$1, /$\phi$2, . . . , /$\phi$m] of pull-down select signals [$\phi$1, $\phi$2, . . . , $\phi$m] output from the pull-down transistor select signal generation circuit 520 described hereinafter.

More specifically, in response to the signals output from a train of m NOR gates NOR11, NOR12, . . . , NOR1m receiving an input signal /IN (i.e. an inverted version of an input signal IN to the level shifter) and the inverted versions of their respective pull-down select signals, the operating n-channel pull-down transistor is cyclically selected from n-channel pulldown transistors M1 to Mn successively.

Furthermore, in response to signals output from a train of m NOR gates NOR21, NOR22, . . . , NOR2m respectively receiving the inverted versions of the pull-down select signals and the signals output from the train of m NOR gates NOR11, NOR12, . . . , NOR1m, the operating n-channel pull-down transistor is cyclically selected from n-channel pull-down transistors N1 to Nm successively.

Figure 17:
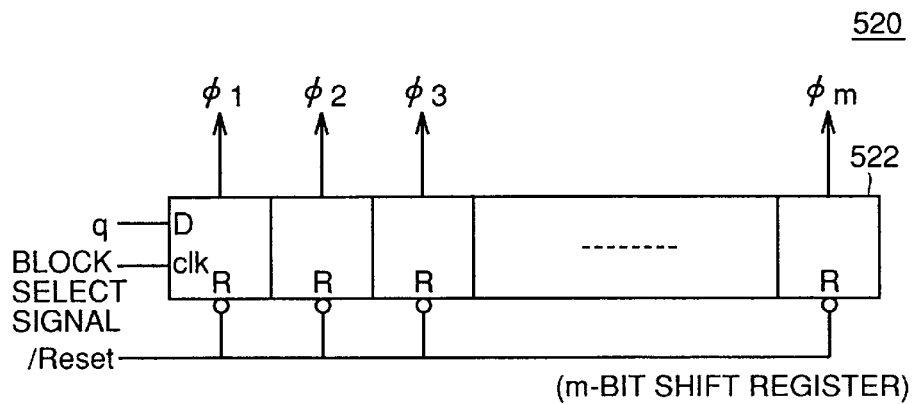
FIG. 17 is a schematic block diagram showing a configuration of a pull-down transistor select signal generation circuit 520.

FIG. 17 is a schematic block diagram showing a configuration of pulldown transistor select signal generation circuit 520.

An m-bit shift register 522 receives a block select signal for selecting a circuit block in which level shifter 500 is present, such as a bank, as a clock signal, and m-bit shift register 522 also receives a signal q which pulses once for every m-th pulse of the block select signal.

Figure 18:
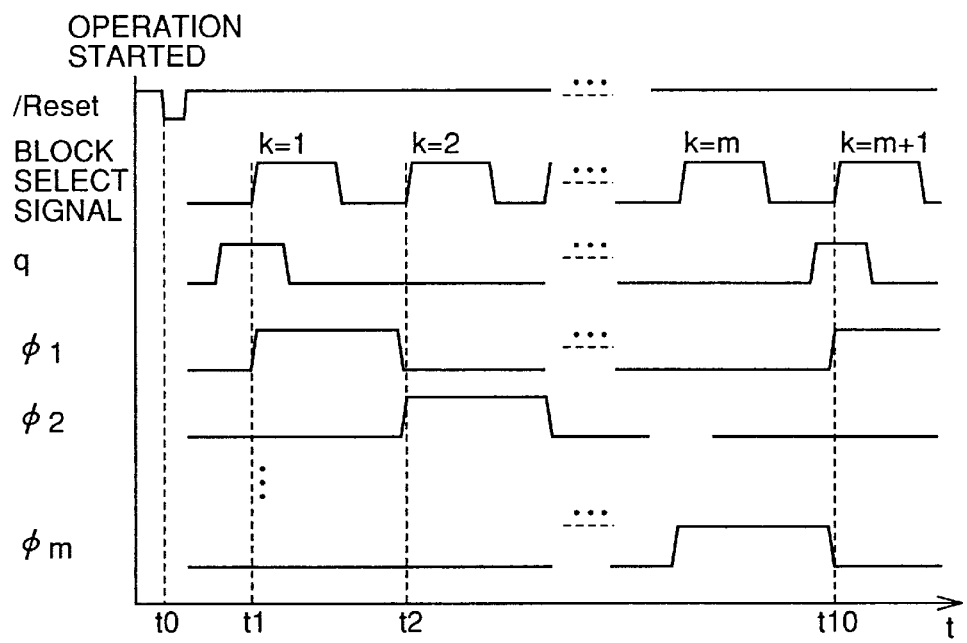
FIG. 18 is a time chart showing a transition of the pull-down transistor select signal.

As a result, pull-down select signals [$\phi$1, $\phi$2, . . . , $\phi$m] cyclically transition from [1, 0, . . . , 01] for a pulse of the block select signal→[0, 1, . . . , 0] for the subsequent pulse of the block select signal→, . . . , →[0, 0, . . . , 1] for the still subsequent pulse of the block select signal successively. FIG. 18 is a time chart for representing the signals thus varied.

That is, at time t0 an m-bit counter is reset in response to a reset signal that is activated (or transitions to a low level). Signal q attains an active state and the operation is initiated.

In activating the block select signal at time t1, signal $\phi$1 output from the first bit of the shift register transitions to an active state in response to active signal q.

At time t2, the block select signal is again activated. Responsively data is transmitted through the shift register and signal $\phi$1 is placed in an inactive state and signal $\phi$2 is placed in an active state.

Similarly, the activated pull-down select signal is changed successively from one to another and cyclically for m activations of the block select signal. When the block select signal is activated m times, signal q is responsively activated again at time t10 and a similar operation is repeated responsively.

Figure 19:
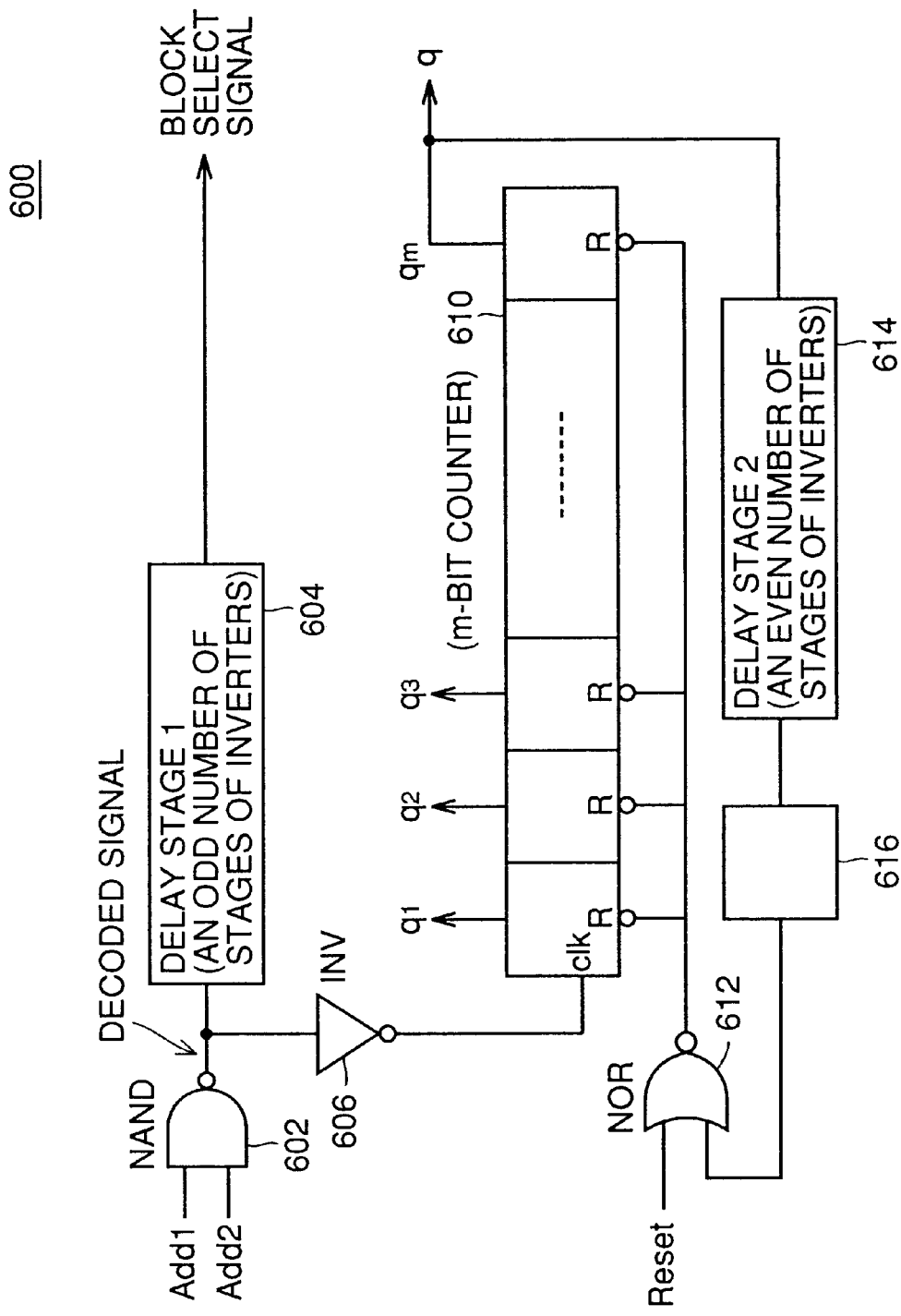
FIG. 19 is a schematic block diagram showing a configuration of a signal q generation circuit 600.

FIG. 19 is a schematic block diagram showing a configuration of a circuit 600 which generates the signal q described above.

Referring to FIG. 19, an NAND circuit 602 receives address signals Add1, Add2 and outputs a decoded signal. A delay circuit 604 receives and delays the decoded signal for a predetermined period of time, inverts the delayed signal and outputs the inverted signal to output the block select signal.

The decoded signal or the output signal from NAND circuit 602 is also inverted by an inverter 606 and input to an m-bit counter 610. A mth-bit signal qm is extracted as the signal q described above.

Signal qm is delayed by a delay stage 614 by a predetermined period of time and is thus provided to a one-shot pulse generation circuit 616. A one-shot pulse output from one-shot pulse generation circuit 616 is provided to one input node of an NOR circuit 612 which receives a reset signal Rest at the other input node. An output from NOR circuit 612 is provided to m-bit counter 610 as a reset signal.

In other words, signal qm is activated for every mth activation of a decoded signal, and when a predetermined period of time elapses the m-bit counter is reset to be placed in a standby state for the activation of a subsequent decoded signal.

Figure 20:
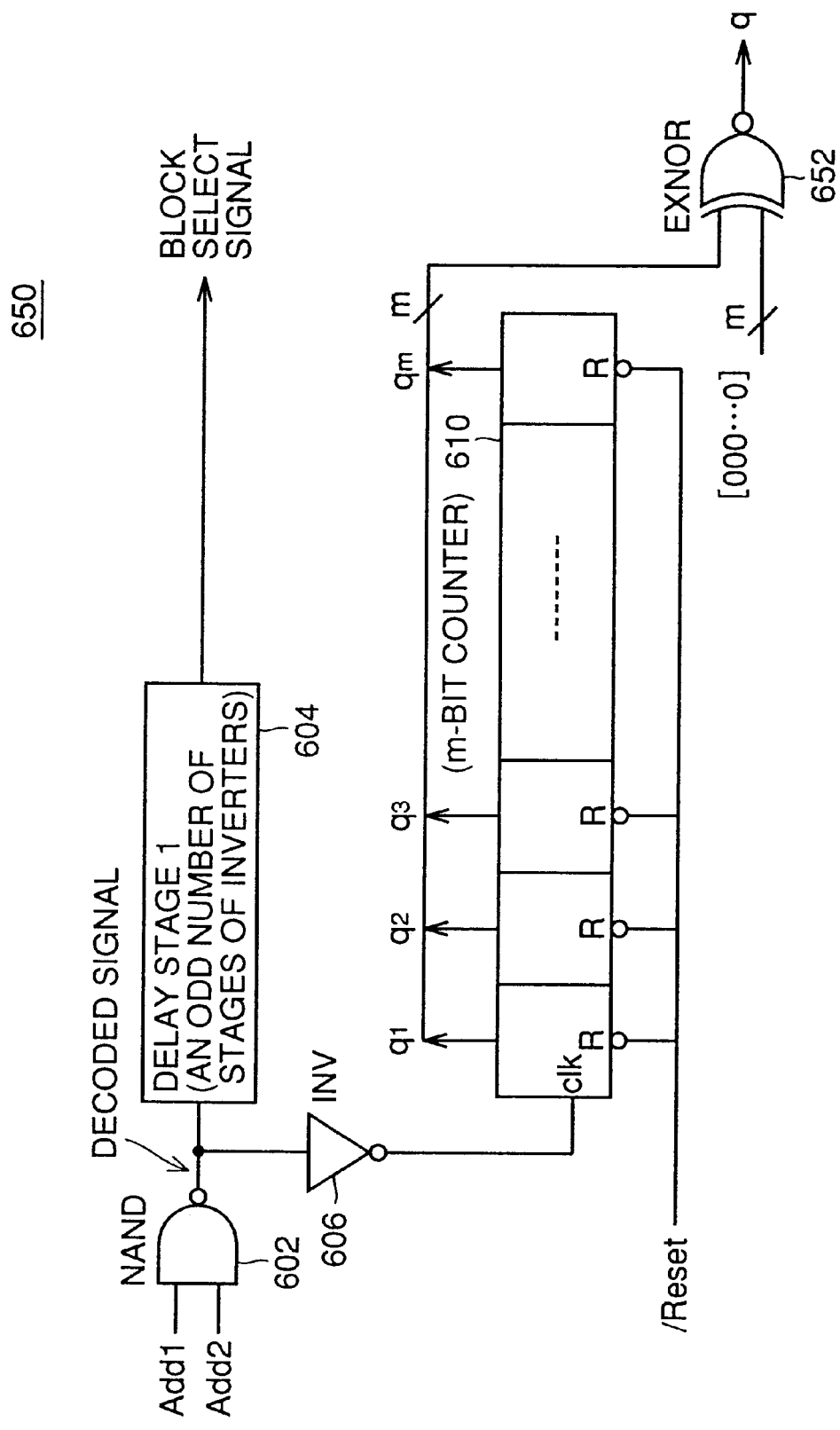
FIG. 20 is a schematic block diagram showing a configuration of another exemplary signal q generation circuit 650.

FIG. 20 is a schematic block diagram showing a configuration of an another exemplary circuit 650 which generates signal q.

As with the generation circuit 600 shown in FIG. 19, in FIG. 20 a decoded signal is input to m-bit counter 610 and the m bits of output [q1, q2, . . . , qm] and the m bits of 0s [0, 0, . . . , 01] are then input to an exclusive OR gate 652 to activate a signal Q for every mth activation of the decoded signal.

Signal q is maintained in an active state until the subsequent decoded signal is activated. The delay time of delay stage 604 and the shift time of the m-bit counter are adjusted to reset signal q before the subsequent decoded signal activates the block select signal.

Sixth Embodiment

Figure 21:
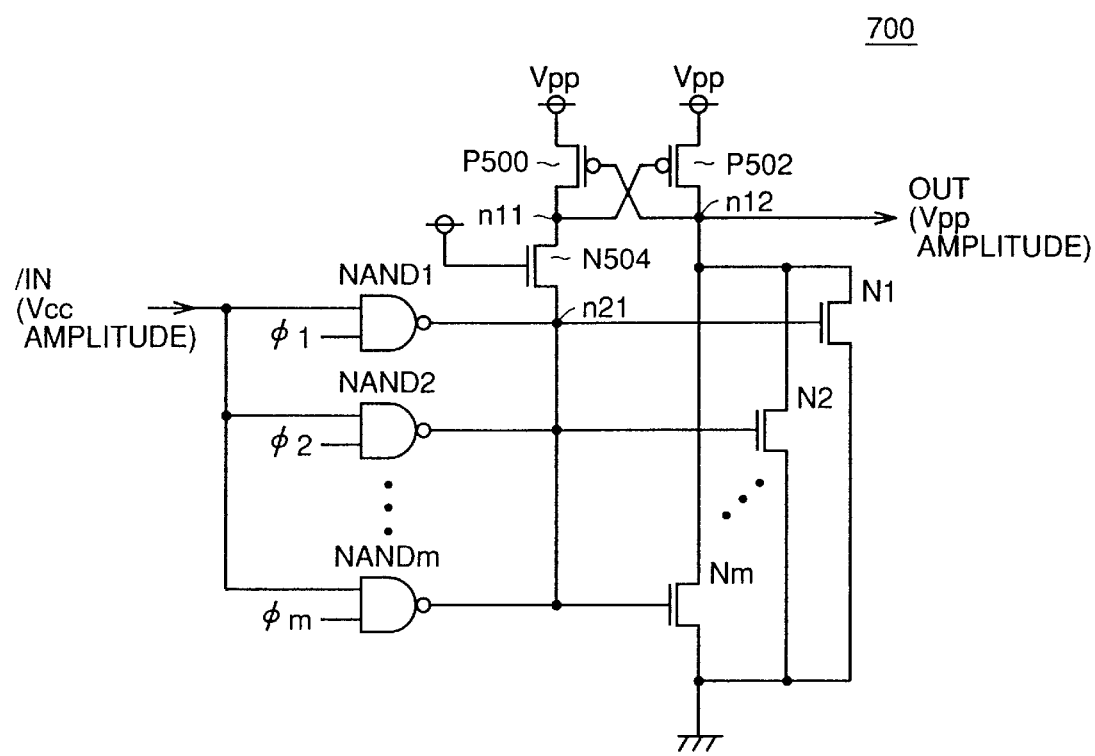
FIG. 21 is a schematic block diagram showing a configuration of a level shifter 700 according to a sixth embodiment of the present invention.

FIG. 21 is a schematic block diagram showing a configuration of a level shifter 700 according to a sixth embodiment of the present invention.

Level shifter 700 includes a p-channel MOS transistor P500 provided between node n11 and boosted potential Vpp, and p-channel MOS transistor P502 provided between n 12 and boosted potential Vpp. The gate and drain of transistor P500 are cross-coupled with the drain and gate of transistor P502.

Level shifter 700 also includes an n-channel transistor N504 provided between and in parallel with nodes n11 and n21 and receiving potential Vcc at its gate, and a train of m n-channel pull-down transistors N1, N2, . . . , Nm provided in parallel between node n12 and a ground potential.

The operating n-channel pull-down transistor is cyclically alternated by driving transistors N1 to Nm in response to the signals output from a train of m NAND gates NAND1, NAND2, . . . , NANDm receiving pull-down select signals and input signal/IN (i.e. an inverted version of the input signal to level shifter 700) which are similar to those according to the fifth embodiment.

The output nodes of the train of NAND gates NAND1, NAND2, NANDm are connected to node n21.

As with the FIG. 16 level shifter 500 according to the fifth embodiment, the operating n-channel pull-down transistor alternates successively from transistor N1→transistor N2→ . . . →transistor Nm→transistor N1→transistor N2→ . . . and cyclically for each cycle for which a block in which the level shifter is present is selected. Such a configuration allows the actual operation frequency of an n-channel transistor to be reduced to 1/m.

Thus, an n-channel pull-down transistor operating with boosted voltage Vpp can have a longevity increased by m times.

Seventh Embodiment

Figure 22:
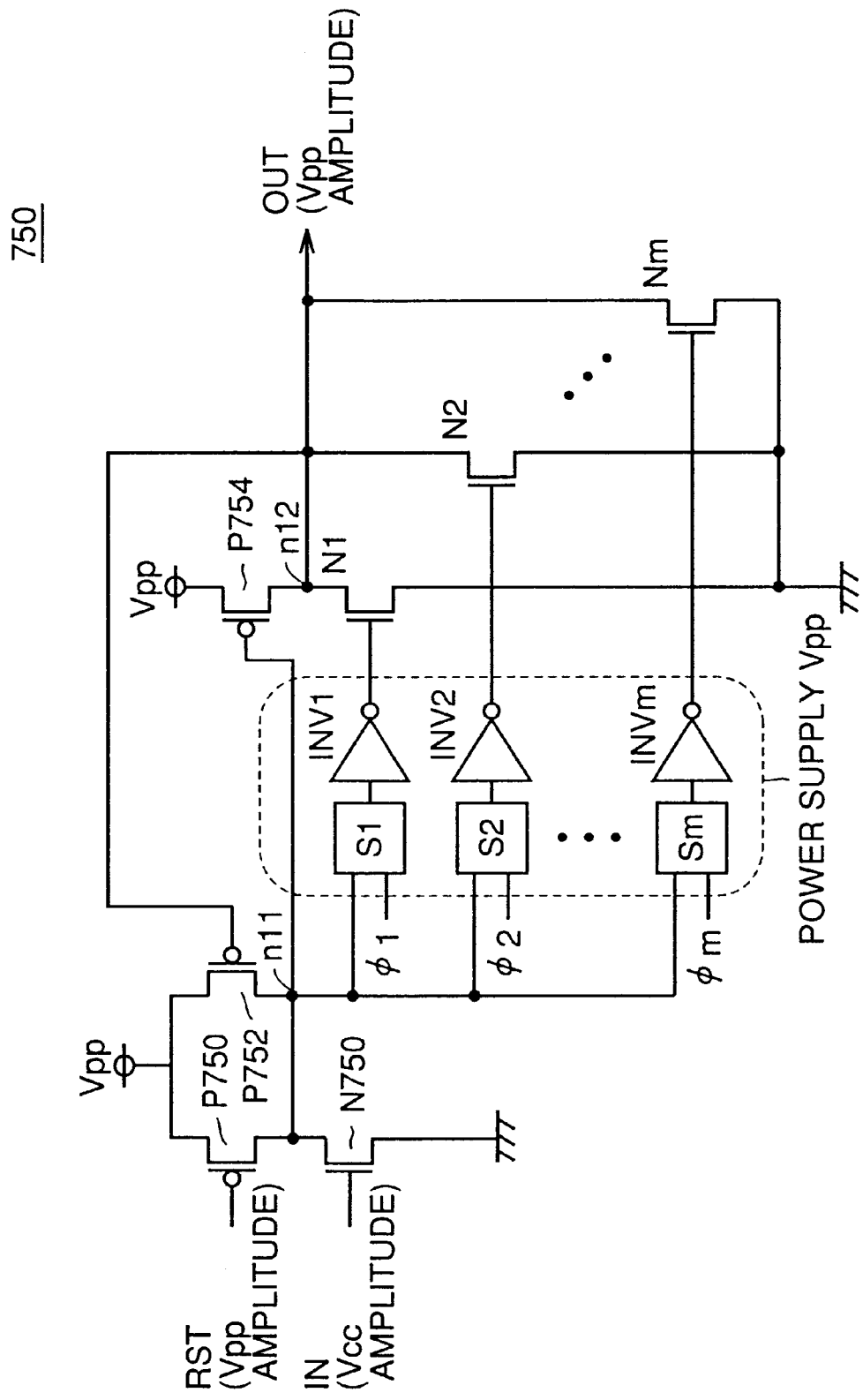
FIG. 22 is a schematic block diagram for illustrating a configuration of a level shifter 750 according to a seventh embodiment of the present invention.

FIG. 22 is a schematic block diagram for illustrating a configuration of a level shifter 750 according to a seventh embodiment of the present invention.

Level shifter 750 includes p- and n-channel MOS transistors P750 and N750 connected in series between power supply potential Vpp and ground potential GND, and a p-channel MOS transistor P752 connected between power supply potential Vpp and a connection point n11 between transistors P750 and N750.

The gate of p-channel MOS transistor P750 receives a signal RST changing in the amplitude of voltage Vpp, and the gate of transistor N750 receives signal IN changing in the amplitude of voltage Vcc.

Level shifter 750 also includes a p-channel MOS transistor P754 provided between power supply potential Vpp and output node N12.

The gate of transistor P754 is connected to node n11. The gate of transistor P752 is connected to output node n12.

Level shifter 750 also has m n-channel pull-down transistors N1, N2, . . . , Nm arranged in parallel. As in the FIG. 16 level shifter 500 according to the fifth embodiment, the operating n-channel pull-down transistor can be alternated successively from N1→ . . . →Nm and cyclically for each cycle for which a block in which the level shifter is present is selected, to reduce the actual operation frequency of the individual nchannel transistors to 1/m. Consequently, the n-channel pull-down transistors operating with boosted voltage Vpp can have a longevity increased by m times.

The operating n-channel pull-down transistor is cyclically alternated by cyclically selecting an operating n-channel pull-down transistor in response to the signals output from a train of m logic gates S1, S2, . . . , Sm receiving the respective pull-down select signals [φ1, φ2, . . . , φm] of the fifth embodiment level shifter and an output from node N11 (i.e. the node varying in the Vpp amplitude).

Figure 23:
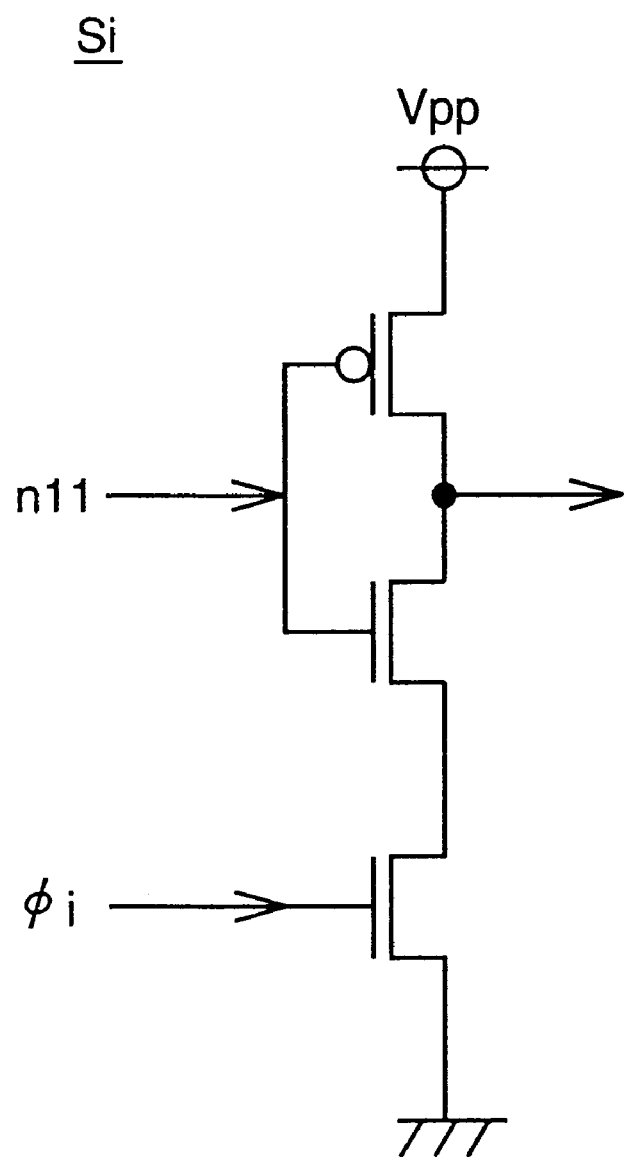
FIG. 23 is a circuit diagram for illustrating a configuration of a logic gate Si.

FIG. 23 is a circuit diagram for illustrating a configuration of a logic gate Si.

Referring to FIG. 23, while logic gate Si (i=1, . . . , m) with node n11 having a potential level of boosted potential Vpp provides an undetermined output only for a signal φi of low level, the output from a logic gate Sk for another signal φk of high level that is definitely present attains a low level. The signal output from logic gate Sk and inverted by an inverter INVk turns on an n-channel MOS transistor Nk.

The n-channel transistors included in the train of logic gates S1, S2, . . . , Sm and the train of inverters INV1, INV2, . . . , INVm successively operates cyclically. Thus, such a plurality of sets of these n-channel transistors each have an operation fiequency reduced to 1/m, as compared to the configuration otherwise configured.

Eighth Embodiment

Figure 24:
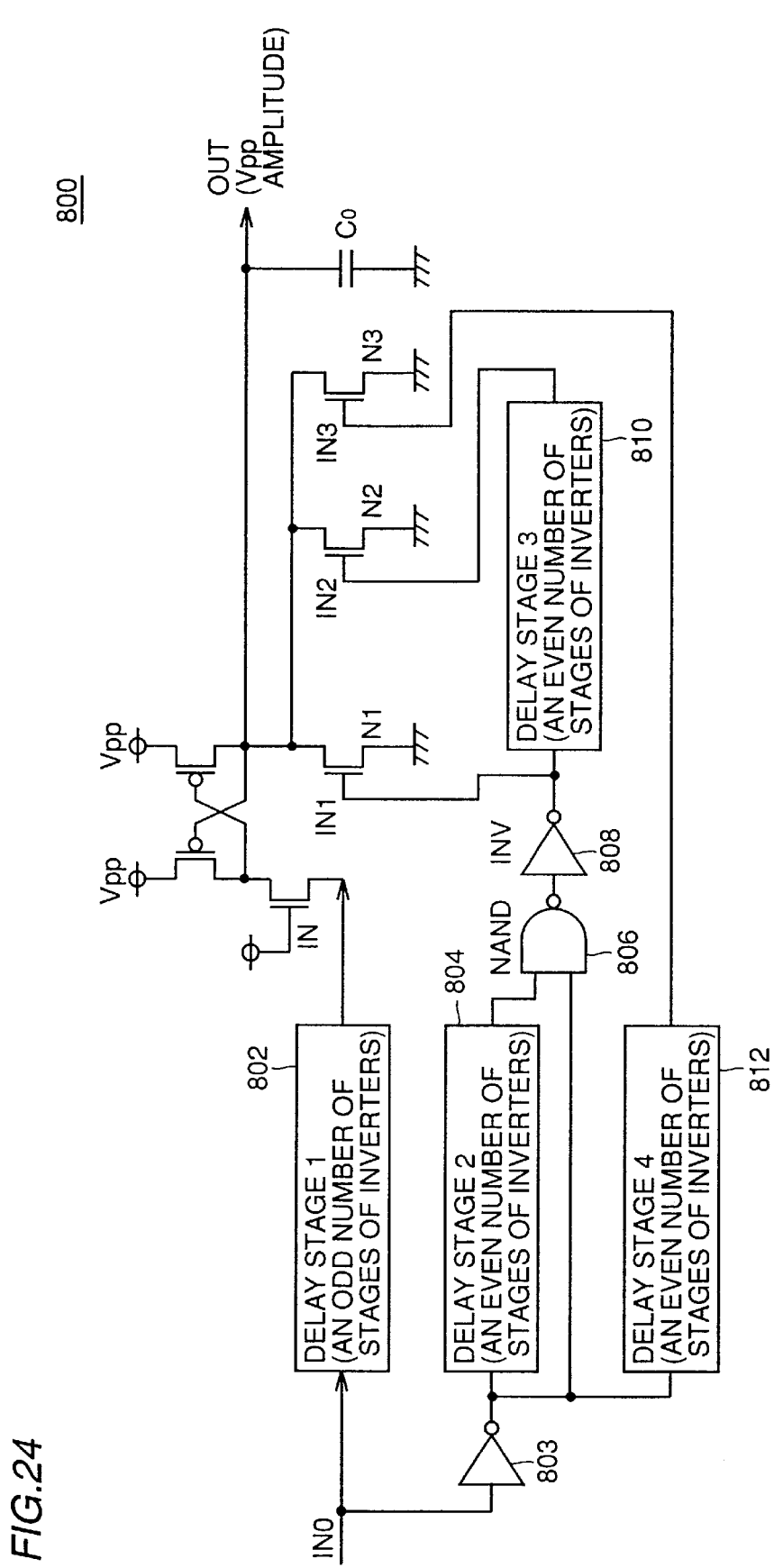
FIG. 24 is a schematic block diagram for illustrating a configuration of a level shifter 800 according to an eighth embodiment of the present invention.

FIG. 24 is a schematic block diagram for illustrating a configuration of a level shifter 800 according to an eighth embodiment of the present invention.

The configuration of level shifter 800 is particularly effective when output OUT has a large load capacity C0 and the output changes requiring a long transition period of time τ.

Level shifter 800 has a plurality of, such as three in FIG. 24, nchannel pull-down transistors N1, N2, N3, arranged in parallel.

A delay stage 802 delays an original input signal IN0 for a predetermined period of time to generate a first input signal IN.

One-shot pulse signals IN1 and IN2 are also produced from signal IN0. Signal IN1, provided via a delay stage 804, NAND circuit 806 and an inverter 808, rises simultaneously with the first input signal IN and falls in a period of time sufficiently shorter than transition time τ. Signal IN2, provided via delay stage 804, NAND circuit 806, inverter 808 and a delay stage 810, is a one-shot pulse having a pulse width similar to that of signal IN1 and rises after signal IN1 rises. Signal IN1 is input to the gate of n-channel MOS transistor N1, and signal IN2 is input to the gate of nchannel MOS transistor N2.

A delay stage 812 outputs a fourth input signal IN3 which rises after input signal IN2 rises and which falls simultaneously with the first input signal. Signal IN3 is input to the gate of n-channel MOS transistor N3.

The second, third and fourth input signals IN1, IN2 and IN3 as described above allow n-channel pull-down transistors N1, N2 and N3 arranged in parallel to be successively pull down with time. Thus, the generation of hot carrier can be distributed between the plurality of n-channel pull-down transistors to increase the longevity of each transistor.

Figure 25:
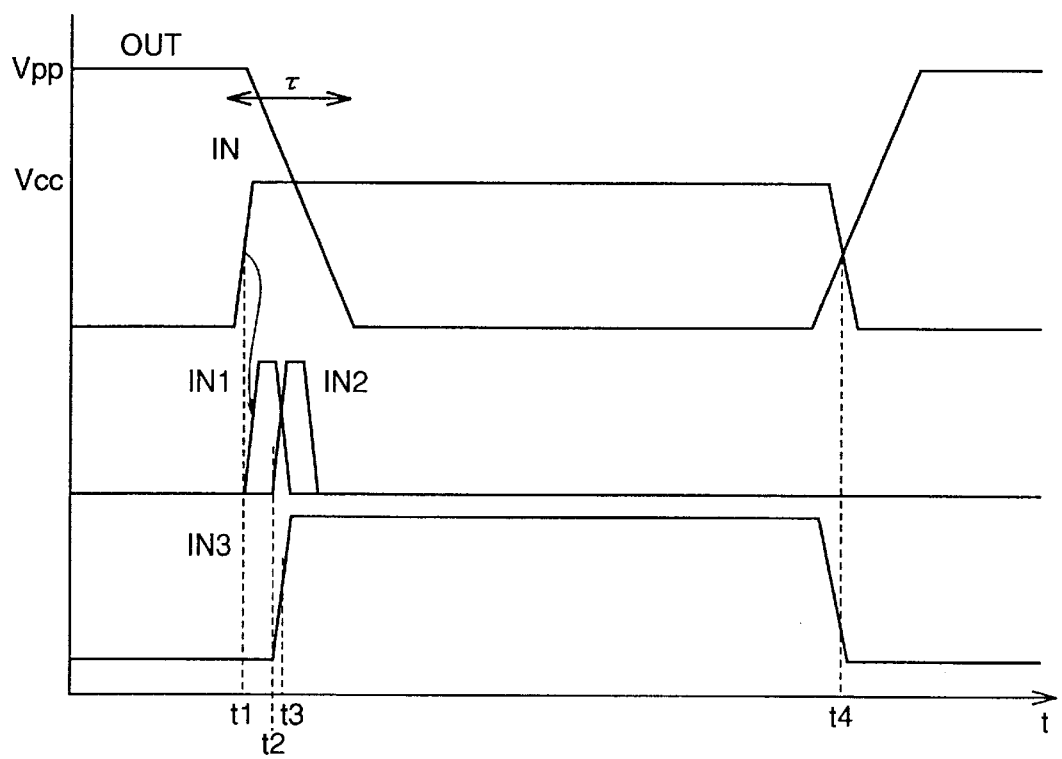
FIG. 25 is a time chart for representing an operation of level shifter 800 shown in FIG. 24.

FIG. 25 is a time chart for representing an operation of level shifter 800 shown in FIG. 24.

At time t1, signal IN is activated. Responsively, signal IN1 is generated as a pulse signal having a predetermined pulse width. Responsively, transistor N1 is turned on duling an active period of signal IN1.

Then, at time t2, signal IN2 is activated and maintained in the active state for a predetermined period of time. For this period, transistor N2 is turned on to provide a discharge operation.

Then, at time t3, signal IN3 is activated. Thus, transistor N3 allows the output node to discharge and also provides an operation to maintain the potential level of the output node.

At time t4, signal IN is placed in an inactive state and responsively signal IN3 also transitions to an inactive state.

Ninth Embodiment

Figure 26:
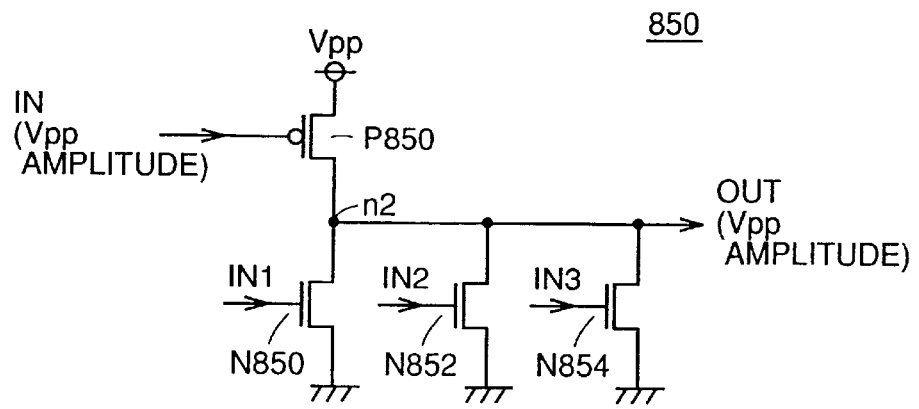
FIG. 26 is a circuit diagram showing a configuration of a power supply potential Vpp driver circuit 850 according to a ninth embodiment of the present invention.

FIG. 26 is a circuit diagram showing a configuration of a power supply potential Vpp driver circuit 850 according to a ninth embodiment of the present invention.

Driver circuit 850 includes a p-channel MOS transistor P850 connected between power supply potential Vpp and an output node n2, and an n-channel MOS transistor N850 provided between and in series with output node N2 and ground potential GND.

An input node of p-channel MOS transistor P850 receives signal IN, and an input node of transistor N850 receives the FIG. 24 signal IN1 according to the eighth embodiment.

Driver 850 also includes an n-channel MOS transistor N852 connected between an output node n1 and ground potential GND, and an n-channel MOS transistor N854 connected between output node N1 and ground potential GND.

The gate of transistor N852 receives the FIG. 24 signal IN2 according to the eighth embodiment, and the gate of transistor N854 receives signal IN3 of the eighth embodiment.

With such a configuration, degradation in reliability of n-channel pull-down transistors N850 to N854 can be restrained in a circuit which drives boosted voltage Vpp.

Tenth Embodiment

Figure 27:
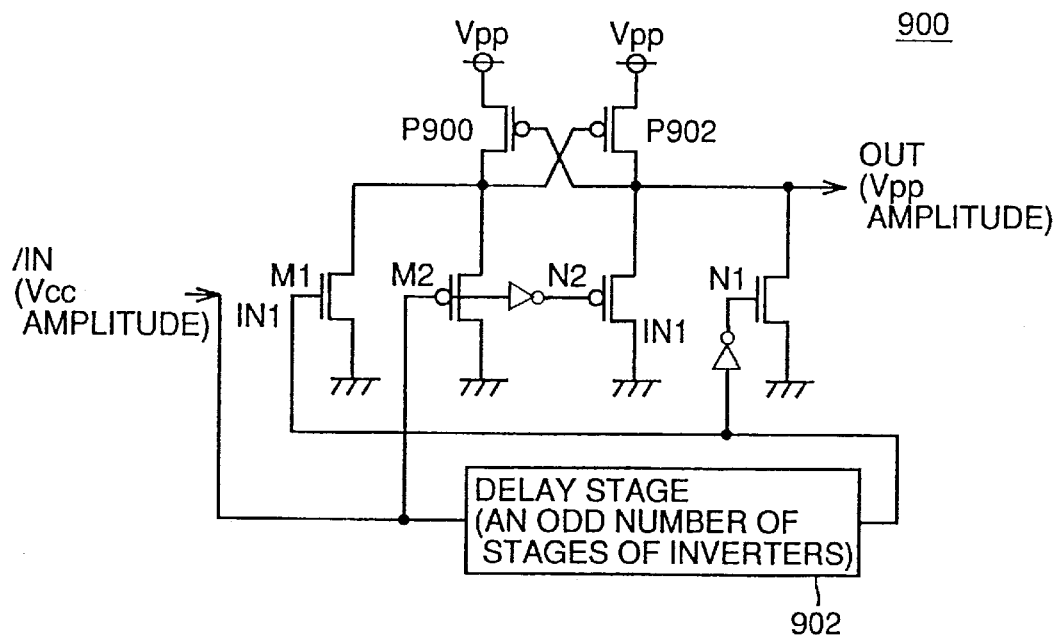
FIG. 27 is a circuit diagram showing a configuration of a level shifter 900 according to a tenth embodiment of the present invention.
Figure 28:
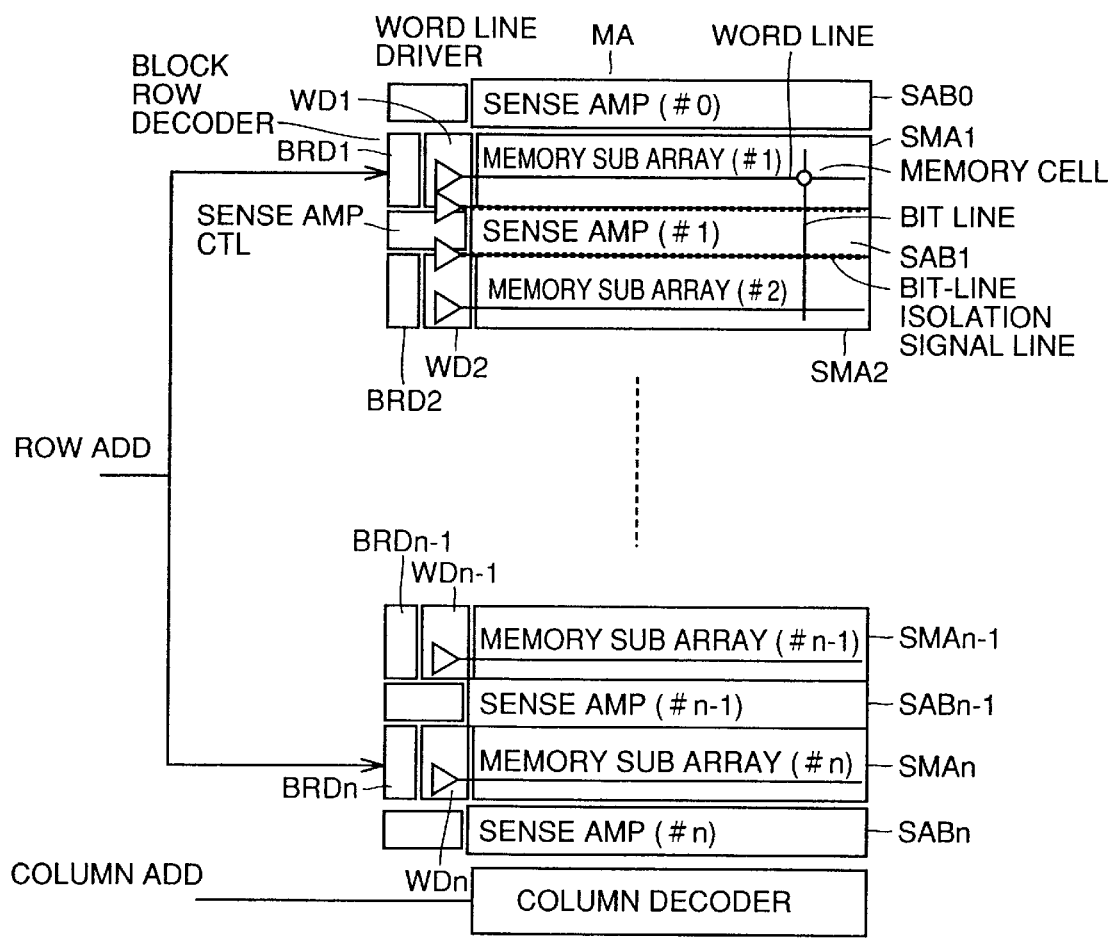
FIG. 28 is a schematic block diagram showing a configuration of a conventional DRAM memory array.
Figure 29:
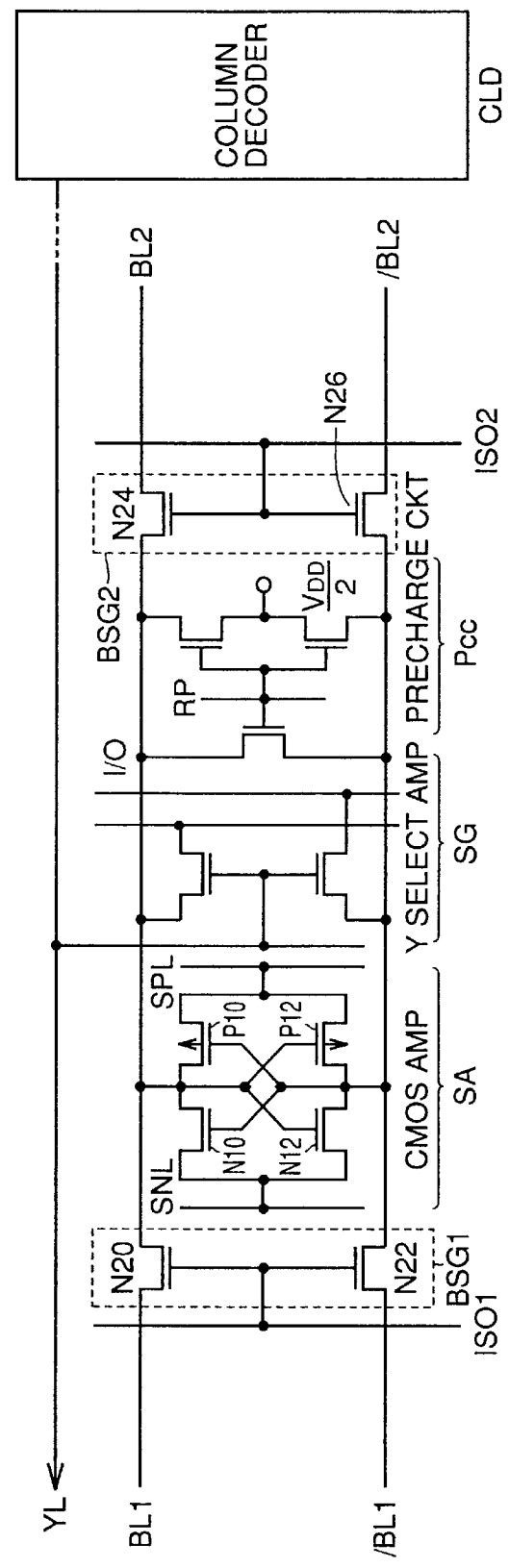
FIG. 29 is a circuit diagram for illustrating a configuration of a sense amplifier band SAB1 shown in FIG. 28.
Figure 30:
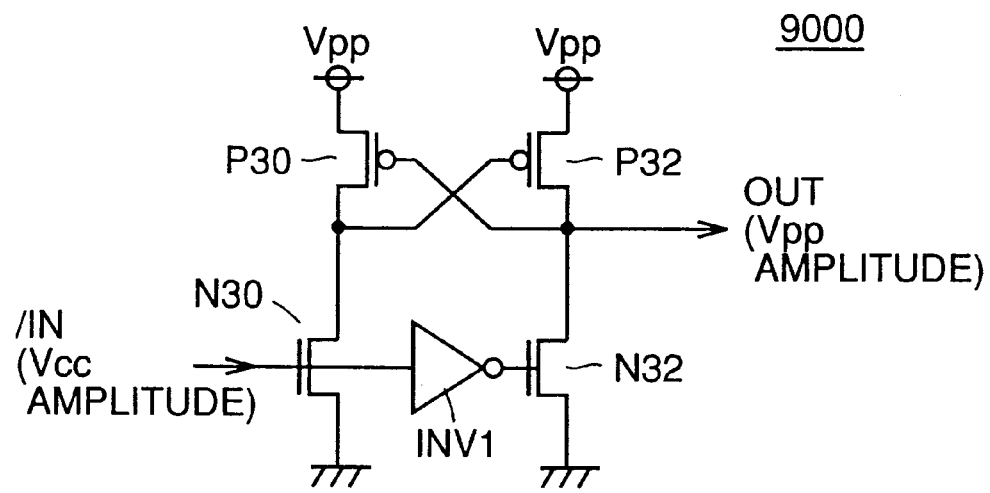
FIG. 30 is a circuit diagram for illustrating a configuration of a first conventional level shifter circuit 9000.
Figure 31:
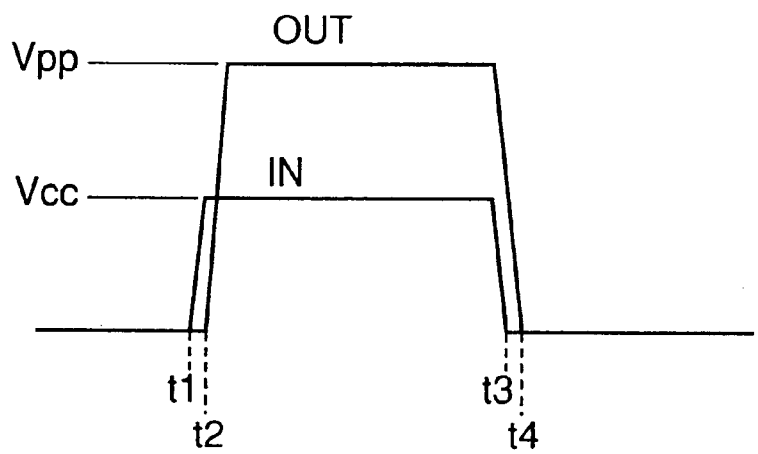
FIG. 31 is a time chart for representing an operation of level shifter 9000 shown in FIG. 30.
Figure 32:
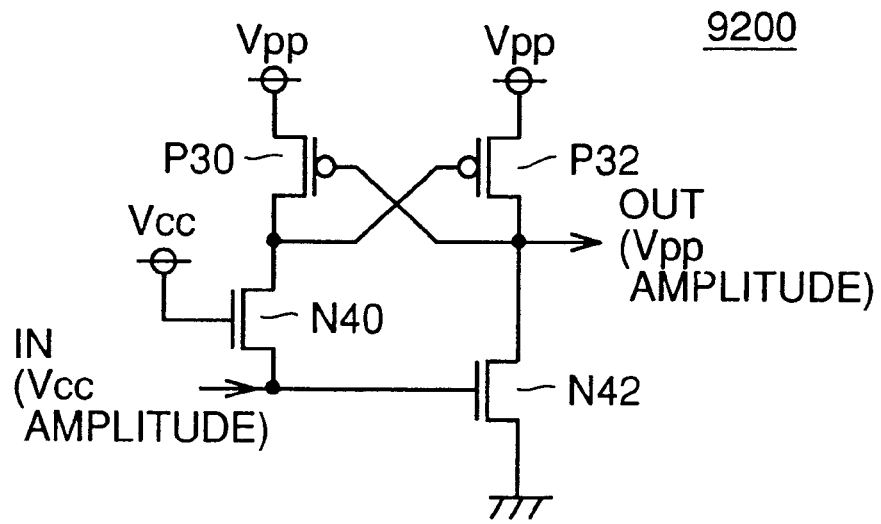
FIG. 32 is a circuit diagram for illustrating a configuration of a second conventional level shifter circuit 9200.
Figure 33:
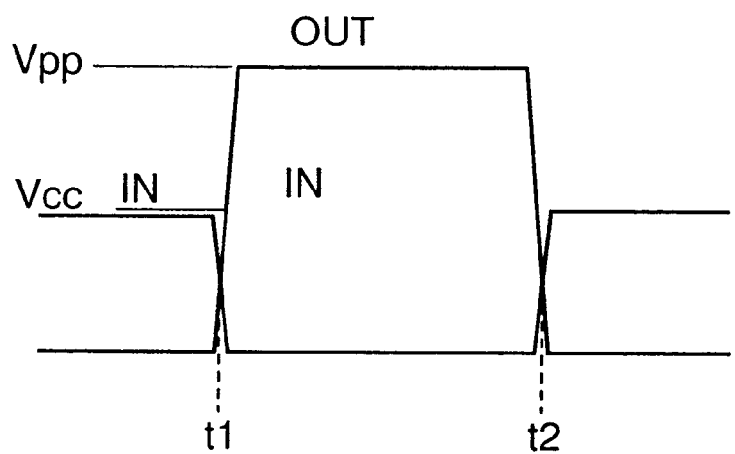
FIG. 33 is a time chart for representing an operation of level shifter circuit 9200 shown in FIG. 32.
Figure 34:
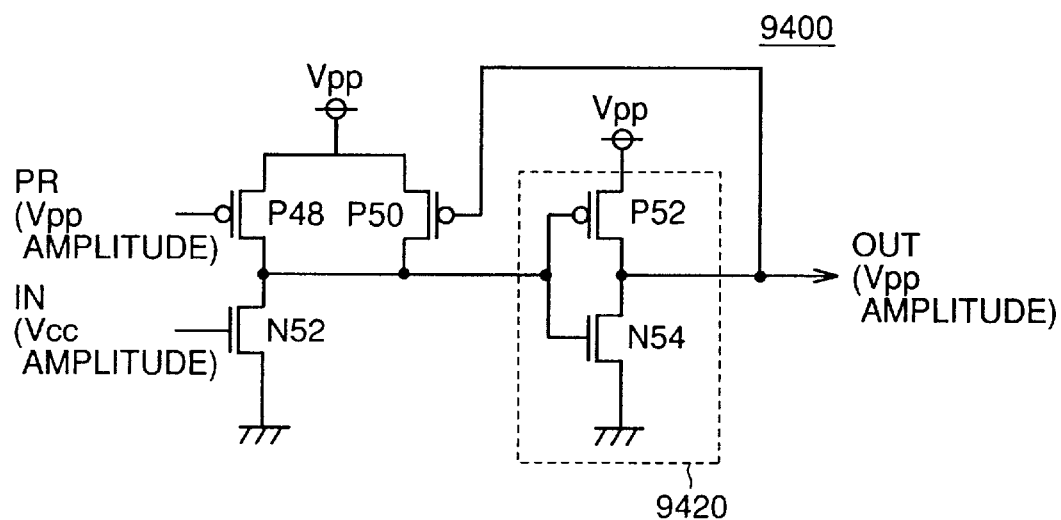
FIG. 34 is a circuit diagram for illustrating a configuration of a third conventional level shifter circuit 9400.
Figure 35:
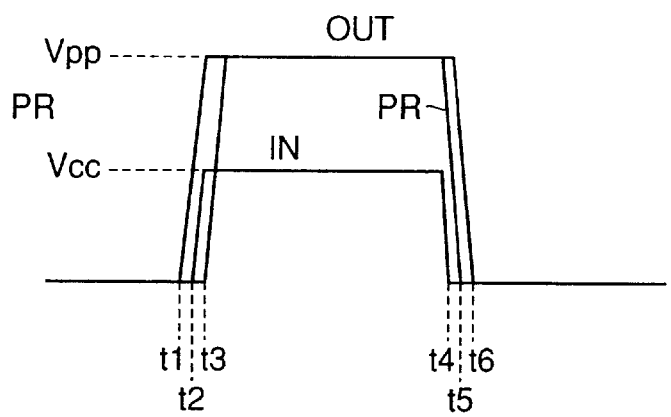
FIG. 35 is a time chart for representing an operation of level shifter circuit 9400.
Figure 36:
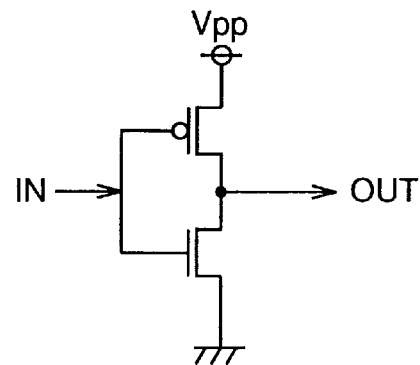
FIG. 36 is a circuit diagram showing a configuration of a conventional inverter.
Figure 37:
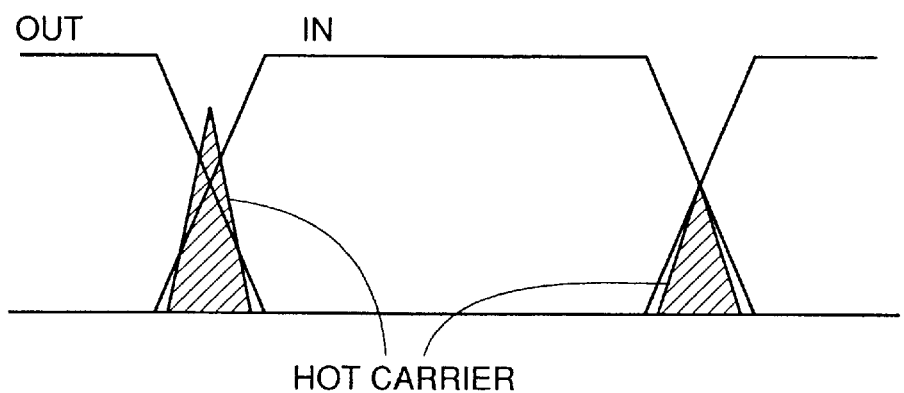
FIG. 37 is a time chart representing generation of hot carrier during a logic transition period.
Figure 38:
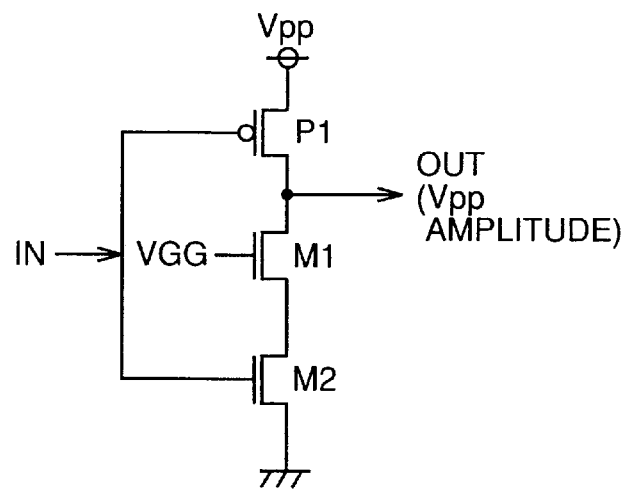
FIG. 38 is a circuit diagram showing an exemplary configuration of an inverter associated with the NOEMI technique.

FIG. 27 is a circuit diagram showing a configuration of a level shifter 900 according to a tenth embodiment of the present invention.

Level shifter 900 includes n-channel pull-down transistors M1 and N1 and p-channel MOS transistors M2 and N2 as pull-down transistors.

Input signal/IN (i.e. an inverted version of a signal input to the level shifter) is input to the gates of p-channel MOS transistors M2 and N2 to provide an initial pull-down operation. A delay stage 902 delays signal/IN for a predetermined period of time to generate signal IN1 which is input to n-channel MOS transistor M1 or N1 to complete the pull-down operation.

Since p-channel MOS transistors M2 and N2 are highly resistant to hot carrier, as described above, and the initial pull-down operation provided by these transistors is followed by the operation of n-channel MOS transistors M1 and N2, the potential levels of the nodes which the nchannel pull-down transistors allow to discharge can be initially lowered and the n-channel pull-down transistors can then operate to reduce hot carrier injection and improve the reliability thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A drive circuit comprising:

a first transistor of a first conductivity type responsive to an input and connected between a first node and an output node;

a second transistor of the first conductivity type responsive to the input and connected between the output node and a second node; and a third transistor of a second conductivity type connected between the output node and the second node in parallel to said second transistor, said third transistor being turned on later than said second transistor.

2. The drive circuit according to claim 1, wherein said first transistor pulls up a potential of the output node, and said second and third transistor pulls down the potential of the output node.

3. The drive circuit according to claim 1, further comprising a delay circuit for turning on said third transistor later than said second transistor.

4. The drive circuit according to claim 1, further comprising:

a fourth transistor of the first conductivity type connected between the first node and a gate of said first transistor, said fourth transistor having a gate connected to the output node;

a fifth transistor of the first conductivity type connected between the gate of said first transistor and the second node; and a sixth transistor of the second conductivity type connected between the gate of said first transistor and the second node in parallel to said fifth transistor, said sixth transistor being turned on later than said fifth transistor.

* * * * *